(12) United States Patent
Li et al.

(10) Patent No.: US 11,514,836 B2
(45) Date of Patent: Nov. 29, 2022

(54) DISPLAY DEVICE INCLUDING DRIVE CIRCUIT

(71) Applicant: Xiamen Tianma Micro-Electronics Co., Ltd., Xiamen (CN)

(72) Inventors: Jieliang Li, Xiamen (CN); Yuping Xu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/334,823

(22) Filed: May 31, 2021

(65) Prior Publication Data
US 2021/0287596 A1    Sep. 16, 2021

(30) Foreign Application Priority Data

Jun. 30, 2020 (CN) .......................... 202010616773.8

(51) Int. Cl.
*G09G 3/20* (2006.01)
*G11C 19/28* (2006.01)
(Continued)

(52) U.S. Cl.
CPC ........... *G09G 3/2092* (2013.01); *G11C 19/28* (2013.01); *G09G 3/20* (2013.01); *G09G 3/3233* (2013.01); *G09G 3/3266* (2013.01); *G09G 2300/0408* (2013.01); *G09G 2300/0819* (2013.01); *G09G 2300/0842* (2013.01); *G09G 2300/0861* (2013.01); *G09G 2310/0251* (2013.01); *G09G 2310/0286* (2013.01)

(58) Field of Classification Search
CPC ...... G09G 3/2092; G09G 3/20; G09G 3/3233; G09G 3/3266; G09G 2300/0408; G09G 2300/0819; G09G 2300/0842; G09G 2300/0861; G09G 2310/0251; G09G 2310/0286; G11C 19/28
See application file for complete search history.

(56) References Cited

U.S. PATENT DOCUMENTS

2012/0075259 A1* 3/2012 Chung ................. G09G 3/3266
345/204
2015/0364083 A1* 12/2015 Jeon ...................... G09G 3/3266
345/76

(Continued)

FOREIGN PATENT DOCUMENTS

CN          110223640 A        9/2019

*Primary Examiner* — Adam J Snyder
(74) *Attorney, Agent, or Firm* — Kilpatrick Townsend & Stockton, LLP

(57) ABSTRACT

A shift register and a display device are provided. A first control device, a second control device and an output device of the shift register all receive a first power signal and a second power signal as working power signals. The first control device controls a signal of a first node and a signal of a second node in response to a first drive signal. The second control device controls the signal of the first node in response to a second drive signal. The output device outputs a third drive signal in response to the signal of the first node or the signal of the second node, and the third drive signal is generated and outputted by utilizing the first drive signal and the second drive signal, and simplifying a circuit configuration of the shift register for generating the third drive signal.

19 Claims, 10 Drawing Sheets

(51) Int. Cl.
  *G09G 3/3266* (2016.01)
  *G09G 3/3233* (2016.01)

(56) References Cited

U.S. PATENT DOCUMENTS

| | | | |
|---|---|---|---|
| 2016/0035262 A1* | 2/2016 | Lee ..................... | G09G 3/3266 345/690 |
| 2018/0040299 A1* | 2/2018 | Zhao .................... | G09G 3/3266 |
| 2018/0061317 A1* | 3/2018 | Morita ................. | G09G 3/3233 |

* cited by examiner

DISPLAY DEVICE INCLUDING DRIVE CIRCUIT

The present application claims the priority to Chinese Patent Application No. 202010616773.8, titled "SHIFT REGISTER AND DISPLAY DEVICE", filed on Jun. 30, 2020, with the China National Intellectual Property Administration, which is incorporated herein by reference in its entirety.

FIELD

The present disclosure relates to the field of display technologies, and more particularly, to a shift register and a display device.

BACKGROUND

A gate-driver on array (GOA) is a component for providing a drive signal for a pixel circuit in a display device. Generally, the gate-driver on array includes multiple cascaded shift registers. Each of the shift registers corresponds to one of gate lines, to provide a drive signal for each row of pixels of the display device, and performing scan driving.

To meet user's requirements for a display device with a narrow bezel, which is also referred to as a full screen, to reduce an area of the bezel occupied by the gate-driver on array has become one of research directions of research personnel.

SUMMARY

To solve the above problems, a shift register and a display device are provided according to the present disclosure, to achieve the purpose of generating and outputting a third drive signal in response to a first drive signal and a second drive signal, which is beneficial to reduce a size of a shift register configured to output the third driving signal.

A shift register is provided, which includes a first control device, a second control device and an output device.

The first control device is configured to: receive a first power signal and a second power signal, and control a signal of a first node and a signal of a second node in response to a first drive signal.

The second control device is configured to: receive the first power signal and the second power signal, and control the signal of the first node in response to a second drive signal.

The output device is configured to: receive the first power signal and the second power signal, and output a third drive signal through an output terminal in response to one of the signal of the first node and the signal of the second node.

A display device, including a pixel circuit is provided.

The pixel circuit is configured to provide a display drive signal for a pixel unit of a display panel. The pixel circuit is connected to a first drive circuit, a second drive circuit, a third drive circuit, and a fourth drive circuit. The first drive circuit is configured to provide a light-emitting control signal for the pixel circuit, the second drive circuit is configured to provide a first gate drive signal for the pixel circuit, and the third drive circuit is configured to provide a second gate drive signal for the pixel circuit. The third drive circuit includes a first control device, a second control device, and an output device.

The first control device is configured to: receive a first power signal and a second power signal (VGL), and control a signal of a first node and a signal of a second node in response to the light-emitting control signal.

The second control device is configured to: receive the first power signal and the second power signal, and control the signal of the first node in response to the first gate drive signal.

The output device is configured to: receive the first power signal and the second power signal, and output the second gate drive signal through an output terminal in response to one of the signal of the first node and the signal of the second node.

A display device, including a pixel circuit is provided.

The pixel circuit is configured to provide a display drive signal for a pixel unit of a display panel. The pixel circuit is connected to a first drive circuit, a second drive circuit, a third drive circuit, and a fourth drive circuit. The first drive circuit is configured to provide a light-emitting control signal for the pixel circuit, the second drive circuit is configured to provide a first gate drive signal for the pixel circuit, and the third drive circuit is configured to provide a second gate drive signal for the pixel circuit.

The third drive circuit is configured to: receive a first power signal and a second power signal, and output the second gate drive signal in response to the light-emitting control signal and the first gate drive signal.

As can be seen from the above embodiments, the shift register and the display device are provided according to the embodiments of the present disclosure. The shift register includes the first control device, the second control device, and the output device. The first control device, the second control device and the output device all receive the first power signal and the second power signal as working power signals. The first control device controls the signal of the first node and the signal of the second node in response to the first drive signal. The second control device controls the signal of the first node in response to the second drive signal. The output device outputs the third drive signal in response to the signal of the first node or the signal of the second node, and the third drive signal is generated and outputted by utilizing the first drive signal and the second drive signal outputted by some other shift register, and simplifying a circuit configuration of the shift register for generating the third drive signal, reducing a size of the shift register for generating the third drive signal, reducing an area of the bezel occupied by gate drive circuits of the shift register, and achieving the "narrow bezel".

BRIEF DESCRIPTION OF THE DRAWINGS

For clearer illustration of the embodiments of the present disclosure, hereinafter are briefly described the drawings to be applied in embodiments of the present disclosure.

DETAILED DESCRIPTION

The technical solutions in the embodiments of the present disclosure will be described clearly and completely hereinafter in conjunction with the drawings in the embodiments of the present disclosure. Apparently, the described embodiments are only some rather than all of the embodiments of the present disclosure.

Figure 1:
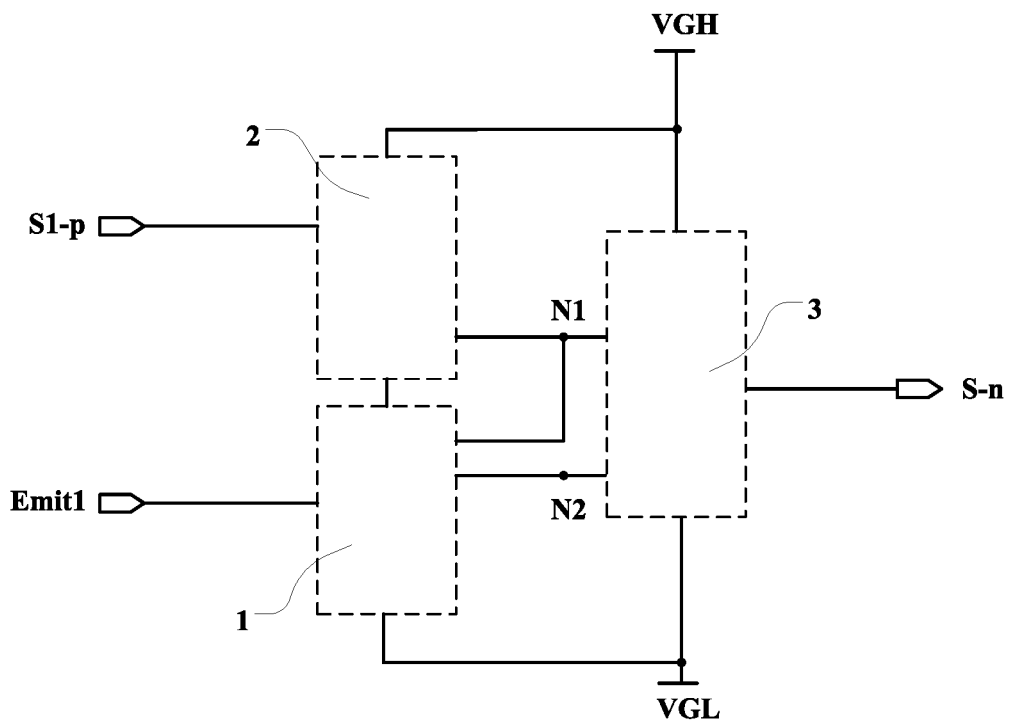
FIG. 1 is a schematic diagram of a circuit structure of a shift register according to an embodiment of the present disclosure.

A shift register is provided according to an embodiment of the present disclosure. Reference is made to FIG. 1, which is a schematic diagram of a circuit structure of the shift register. The shift register includes: a first control device 1, a second control device 2 and an output device 3.

The first control device 1 is configured to: receive a first power signal VGH and a second power signal VGL, and control a signal of a first node N1 and a signal of a second node N2 in response to a first drive signal Emit1.

The second control device 2 is configured to: receive the first power signal VGH and the second power signal VGL, and control the signal of the first node N1 in response to a second drive signal S1-$p$.

The output device 3 is configured to: receive the first power signal VGH and the second power signal VGL, and output a third drive signal S-$n$ through an output terminal in response to the signal of the first node N1 or the signal of the second node N2.

Figure 2:
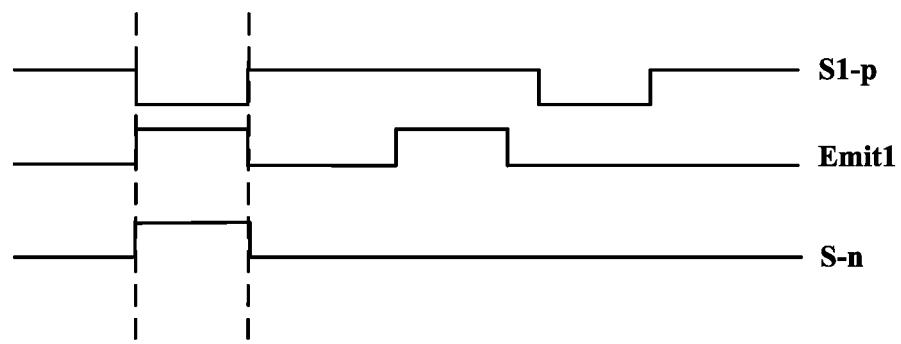
FIG. 2 is a schematic diagram of a timing relationship of a first drive signal, a second drive signal and a third drive signal according to an embodiment of the present disclosure.

The first drive signal Emit1 includes a periodic signal formed by arranging a high level and a low level according to a duration and an order. Similarly, the second drive signal S1-$p$ includes a periodic signal formed by arranging a high level and a low level according to a duration and an order. The first drive signal Emit1 has a different timing sequence from the second drive signal S1-$p$. Reference is made to FIG. 2, which is a schematic diagram of a feasible timing relationship of the first drive signal Emit1, the second drive signal S1-$p$ and the third drive signal S-$n$. As shown in FIG. 2, the shift register is controlled in response to the first drive signal Emit1 and the second drive signal S1-$p$ through the cooperation of the first control device 1, the second control device 2 and the output device 3, to output the third drive signal S-$n$ having another timing sequence. The circuit structure of the shift register is simplified, the size of the shift register for generating the third drive signal S-$n$ is reduced, and reducing the frame area occupied by the gate drive circuit of the shift register, and realizing the "narrow bezel".

It should be noted that, in this embodiment, the first power signal may be VGH, that is, a high-level signal. The second power signal may be VGL, that is, a low-level signal. In other feasible embodiments, the first power signal may be a low-level signal, while the second power signal may be a high-level signal.

It should be noted that, the first control device 1 controlling the signal of the first node N1 and the signal of the second node N2 in response to the first drive signal Emit1 may refer to: when the first drive signal Emit1 is at a low level or a high level, the signal of the first node N1 is controlled to be at a high level or at a low level, and the signal of the second node N2 is controlled to be at a high level or at a low level. Similarly, the second control device 2 controlling the signal of the first node N1 in response to the second drive signal S1-$p$ may refer to: when the second drive signal S1-$p$ is at a low level or a high level, the signal of the first node N1 is controlled to be at a high level or at a low level. The logic of the first control device 1 responding to the first drive signal Emit1 and the logic of the second control device 2 responding to the second drive signal S1-$p$ are not limited in the present disclosure, as long as the timing relationship between the first drive signal Emit1 and the second drive signal S1-$p$ is adapted to the logic of the first control device 1 responding to the first drive signal Emit1 and the logic of the second control device 2 responding to the second drive signal S1-$p$, to avoid a conflict generated when the first control device 1 and the second control device 2 control the signal of the first node N1 at the same time, that is, the first control device 1 controls the signal of the first node N1 to be at a high level, while the second control device 2 controls the signal of the first node N1 to be at a low level; or the first control device 1 controls the signal of the first node N1 to be at a low level, while the second control device 2 controls the signal of the first node N1 to be at a high level.

The output device 3 outputting the third drive signal S-$n$ through the output terminal in response to the signal of the first node N1 or the signal of the second node N2 may refer to: when the signal of the first node N1 is at a low level and the signal of the second node N2 is at a high level, the third drive signal S-$n$ at a high level is outputted through the output terminal; or when the signal of the first node N1 is at a high level and the signal of the second node N2 is at a low level, the third drive signal S-$n$ at a low level is outputted through the output terminal.

The output device 3 outputting the third drive signal S-$n$ through the output terminal in response to the signal of the first node N1 or the signal of the second node N2 may refer to: when the signal of the first node N1 is at a high level and the signal of the second node N2 is at a low level, the third drive signal S-$n$ at a high level is outputted through the output terminal; or when the signal of the first node N1 is at a low level and the signal of the second node N2 is at a high level, the third drive signal S-$n$ at a low level is outputted through the output terminal.

The feasible structure and control logic of the first control device 1, the second control device 2 and the output device 3 are described as follows.

Figure 3:
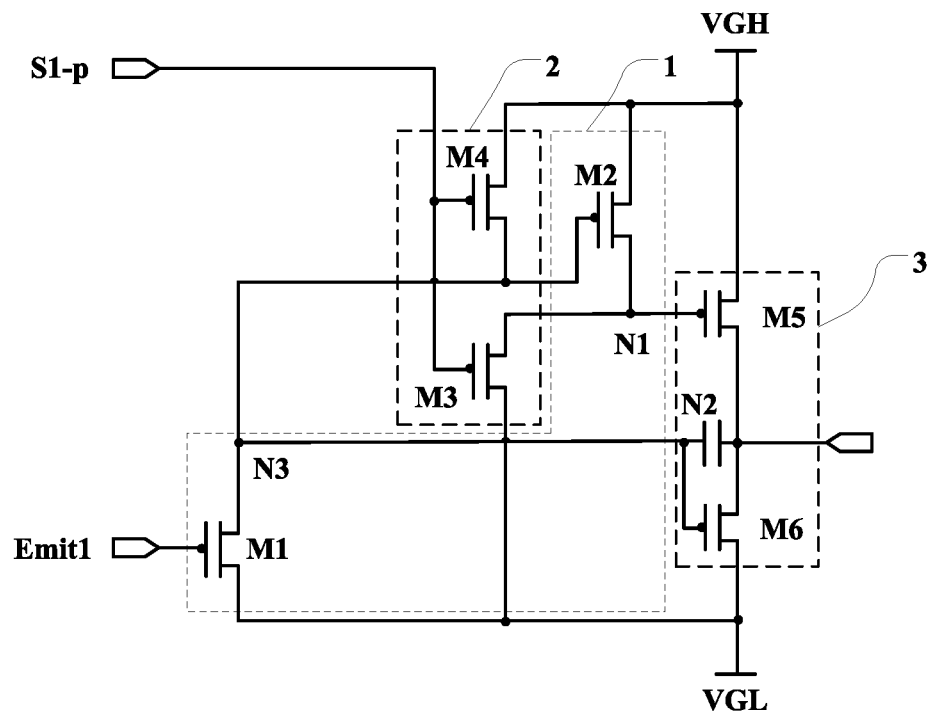
FIG. 3 is a schematic diagram of a circuit structure of a shift register according to an embodiment of the present disclosure.

Reference is made to FIG. 3, which is a schematic diagram of a circuit structure of a shift register according to an embodiment of the present disclosure. As shown in FIG.

3, the first control device 1 further includes a third node N3 connected to the second node N2.

As shown in FIG. 3, the third node N3 is connected to the second node N2. When the first control device 1 is turned on in response to the first drive signal, the second power signal VGL is transmitted to the second node N2 through the third node N3, to control the signal of the second node N2.

Referring to FIG. 3, the first control device 1 includes a first transistor M1 and a second transistor M2. The first transistor M1 is configured to transmit the second power signal VGL to the third node N3 in response to the first drive signal Emit1.

The second transistor M2 is configured to transmit the first power signal VGH to the first node N1 in response to the first drive signal Emit1.

In this embodiment, the first control device 1 functions to control the signal of the first node N1 and the signal of the third node N3 through only the two transistors. Thus, the structure of the device is simple, which is beneficial to simplifying the overall circuit structure of the shift register.

Referring to FIG. 3, a connection relationship of the first transistor M1 and the second transistor M2 is described as follows.

A first terminal of the first transistor M1 is connected to the second power signal VGL, a second terminal of the first transistor M1 is connected to the third node N3, and a control terminal of the first transistor M1 is connected to the first drive signal Emit1.

A first terminal of the second transistor M2 is connected to the first power signal VGH, a second terminal of the second transistor M2 is connected to the first node N1, and a control terminal of the second transistor M2 is connected to the first drive signal Emit1.

In FIG. 3, the first transistor M1 and the second transistor M2 both being P-type transistors are described as an example for illustration. In other embodiments of the present disclosure, the first transistor M1 and the second transistor M2 may alternatively be N-type transistors, which is not limited in the present disclosure.

If the first transistor M1 and the second transistor M2 are both P-type transistors, the first transistor M1 transmitting the second power signal VGL to the third node N3 in response to the first drive signal Emit1 includes: the first transistor M1 being turned on when the first drive signal Emit1 is at a low level, and the second power signal VGL being inputted through the first terminal of the first transistor M1 and transmitted to the third node N3 through the turned-on first transistor M1. Since the third node N3 is connected to the second node N2, the second power signal VGL is transmitted to the second node N2 through the third node N3, and the signal of the second node N2 is the second power signal VGL, and controlling the signal of the second node N2.

Similarly, the second transistor M2 transmitting the first power signal VGH to the first node N1 in response to the first drive signal Emit1 includes: when the first transistor M1 is turned on in response to the first drive signal Emit1, the second transistor M2 receiving the second power signal VGL through the control terminal and being turned on, and the first power signal VGH being transmitted to the first node N1 through the turned-on second transistor M2, and the signal of the first node N1 is the first power signal VGH, and controlling the signal of the first node N1.

Referring to FIG. 3, the second control device 2 includes a third transistor M3 and a fourth transistor M4. The third transistor M3 is configured to transmit the second power signal VGL to the first node N1 in response to the second drive signal S1-$p$. The fourth transistor M4 is configured to transmit the first power signal VGH to the third node N3 in response to the second drive signal S1-$p$.

In this embodiment, the second control device 2 functions to control the signal of the first node N1 through only the two transistors. Thus, the structure of the device is simple, which is beneficial to simplifying the overall circuit structure of the shift register. In addition, the signal of the third node N3 is also controlled by the second control device 2, and avoiding the output device 3 outputting wrong signals due to the signal of the first node N1 and the signal of the third node N3 (or the signal of the second node N2) being the same.

Referring to FIG. 3, a connection relationship of the third transistor M3 and the fourth transistor M4 is described as follows.

A first terminal of the third transistor M3 is connected to the second power signal VGL, a second terminal of the third transistor M3 is connected to the first node N1, and a control terminal of the third transistor M3 is connected to the second drive signal S1-$p$.

A first terminal of the fourth transistor M4 is connected to the first power signal VGH, a second terminal of the fourth transistor M4 is connected to the third node N3, and a control terminal of the fourth transistor M4 is connected to the second drive signal S1-$p$.

In FIG. 3, the third transistor M3 and the fourth transistor M4 both being P-type transistors are described as an example for illustration. In other embodiments of the present disclosure, the third transistor M3 and the fourth transistor M4 may alternatively be N-type transistors, which is not limited in the present disclosure.

If the third transistor M3 and the fourth transistor M4 are both P-type transistors, the third transistor M3 transmitting the second power signal VGL to the first node N1 in response to the second drive signal S1-$p$ includes: the third transistor M3 being turned on when the second drive signal S1-$p$ is at a low level, and the second power signal VGL being inputted through the first terminal of the third transistor M3 and transmitted to the first node N1 through the turned-on third transistor M3, and the signal of the first node N1 is the second power signal VGL, and controlling the signal of the first node N1.

The fourth transistor M4 transmitting the first power signal VGH to the third node N3 in response to the second drive signal S1-$p$ includes: the fourth transistor M4 being turned on when the second drive signal S1-$p$ is at a low level, and the first power signal VGH being inputted through the first terminal of the fourth transistor M4 and transmitted to the third node N3 through the turned-on fourth transistor M4. Since the third node N3 is connected to the second node N2, the first power signal VGH is transmitted to the second node N2 through the third node N3, and the signal of the second node N2 is the first power signal VGH, and avoiding the output device 3 outputting a wrong signal since the signal of the first node N1 and the signal of the second node N2 are the same power signal at the same time.

Referring to FIG. 3, the output device 3 includes a fifth transistor M5 and a sixth transistor M6. The fifth transistor M5 is configured to transmit the first power signal VGH to the output terminal in response to the signal of the first node N1.

The sixth transistor M6 is configured to transmit the second power signal VGL to the output terminal in response to the signal of the second node N2.

Generally, the first power signal VGH is a high-level signal, and the second power signal VGL is a low-level signal. When the fifth transistor M5 transmits the first power signal VGH to the output terminal in response to the signal of the first node N1, the third drive signal S-n is at a high level. When the sixth transistor M6 transmits the second power signal VGL to the output terminal in response to the signal of the second node N2, the third drive signal S-n is at a low level.

In this embodiment, the output device 3 functions to output the third drive signal S-n in response to the signal of the first node N1 or the signal of the second node N2 through only the two transistors. Thus, the structure of the device is simple, which is beneficial to simplifying the overall circuit structure of the shift register.

Referring to FIG. 3, a connection relationship of the fifth transistor M5 and the sixth transistor M6 is described as follows.

A first terminal of the fifth transistor M5 is connected to the first power signal VGH, a second terminal of the fifth transistor M5 is connected to the output terminal, and a control terminal of the fifth transistor M5 is connected to the first node N1.

A first terminal of the sixth transistor M6 is connected to the second power signal VGL, a second terminal of the sixth transistor M6 is connected to the output terminal, and a control terminal of the sixth transistor M6 is connected to the second node N2.

In FIG. 3, the fifth transistor M5 and the sixth transistor M6 both being P-type transistors are described as an example for illustration. In other embodiments of the present disclosure, the fifth transistor M5 and the sixth transistor M6 may alternatively be N-type transistors, which is not limited by the present disclosure.

If the fifth transistor M5 and the sixth transistor M6 are both P-type transistors, the fifth transistor M5 transmitting the first power signal VGH to the output terminal in response to the signal of the first node N1 includes: the fifth transistor M5 being turned on when the signal of the first node N1 is at a low level, and the first power signal VGH being inputted through the first terminal of the fifth transistor M5 and transmitted to the output terminal through the turned-on fifth transistor M5.

The sixth transistor M6 transmitting the second power signal VGL to the output terminal in response to the signal of the second node N2 includes: the sixth transistor M6 being turned on when the signal of the second node N2 is at a low level, and the second power signal VGL being inputted through the first terminal of the sixth transistor M6 and transmitted to the output terminal through the turned-on sixth transistor M6.

Taking the shift register shown in FIG. 3 as an example, in combination with FIG. 2, it can be seen that, only when the first drive signal Emit1 is at a high level and the second drive signal S1-p is at a low level, the shift register outputs a high-level third drive signal S-n. When the first drive signal Emit1 and the second drive signal S1-p are other signal combinations, the shift register outputs a low-level third drive signal S-n.

Figure 4:
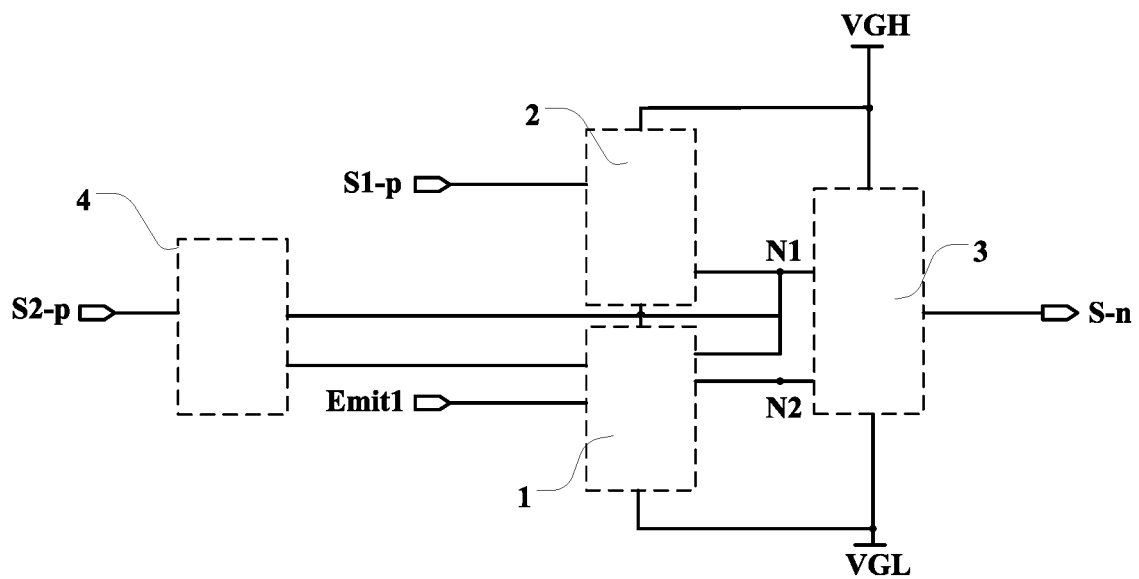
FIG. 4 is a schematic diagram of a circuit structure of a shift register according to an embodiment of the present disclosure.

On the basis of the foregoing embodiments, in another embodiment of the present disclosure, a shift register is provided. Reference is made to FIG. 4, which is a schematic diagram of a circuit structure of the shift register according to an embodiment of the present disclosure. The shift register further includes a third control device 4. The third control device 4 is configured to: receive the first power signal VGH and the second power signal VGL, and control the signal of the first node N1 in response to a fourth drive signal S2-p.

In this embodiment, the signal of the first node N1 is controlled through the cooperation of the third control device 4 and the fourth drive signal S2-p. Thus, the control logic of the shift register is more diversified. That is, a third control signal outputted by the shift register has more diversified timing sequences based on the cooperation of the first control signal, the second control signal and the fourth control signal, and satisfying requirements of different gate drive circuits.

Figure 5:
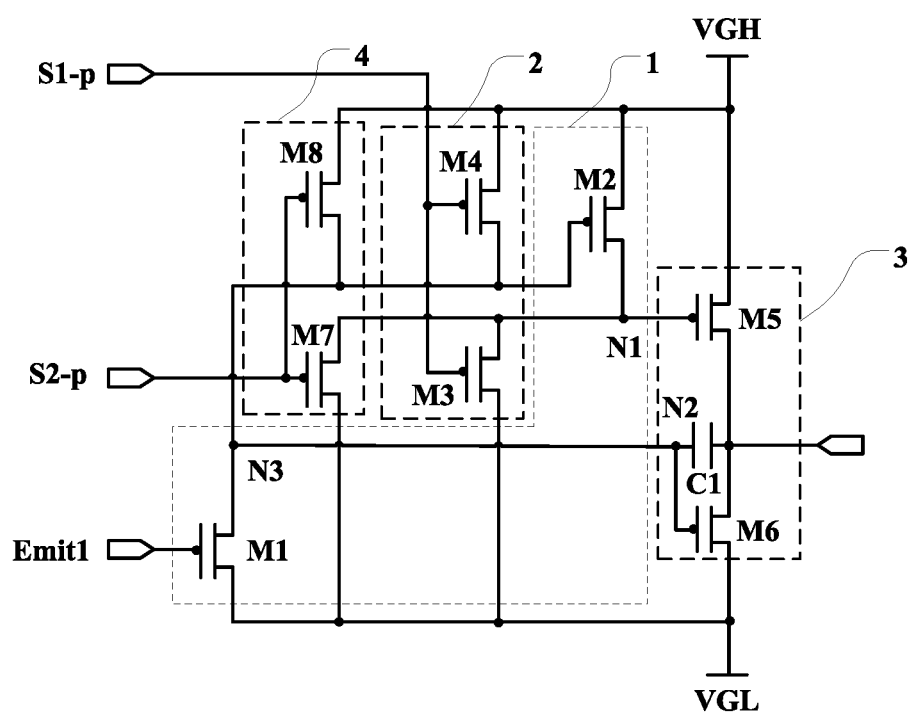
FIG. 5 is a schematic diagram of a circuit structure of a shift register according to an embodiment of the present disclosure.

FIG. 5 further shows a first capacitor C1 of the output device 3. One terminal of the first capacitor C1 is connected to the second node N2, and the other terminal of the first capacitor C1 is connected to the output terminal. The first capacitor C1 is configured to maintain a potential of the second node N2.

For a specific structure of the third control device 4, reference is made to FIG. 5, which is a schematic diagram of a circuit structure of a shift register according to an embodiment of the present disclosure. The third control device 4 includes: a seventh transistor M7 and an eighth transistor M8.

The seventh transistor M7 is configured to transmit the second power signal VGL to the first node N1 in response to the fourth drive signal S2-p.

The eighth transistor M8 is configured to transmit the first power signal VGH to the third node N3 in response to the fourth drive signal S2-p.

In this embodiment, the third control device 4 functions to control the signal of the first node N1 through only the two transistors. Thus, the structure of the device is simple, which is beneficial to simplify the overall circuit structure of the shift register. In addition, the signal of the third node N3 is also controlled by the third control device 4, and avoiding the output device 3 outputting wrong signals due to the signal of the first node N1 and the signal of the third node N3 (or the signal of the second node N2) being the same.

Referring to FIG. 5, a connection relationship of the seventh transistor M7 and the eighth transistor M8 is described specifically as follows.

A first terminal of the seventh transistor M7 is connected to the second power signal VGL, a second terminal of the seventh transistor M7 is connected to the first node N1, and a control terminal of the seventh transistor M7 is connected to the fourth drive signal S2-p.

A first terminal of the eighth transistor M8 is connected to the first power signal VGH, a second terminal of the eighth transistor M8 is connected to the third node N3, and a control terminal of the eighth transistor M8 is connected to the fourth drive signal S2-p.

In FIG. 5, the seventh transistor M7 and the eighth transistor M8 both being P-type transistors are described as an example for illustration. In other embodiments of the present disclosure, the seventh transistor M7 and the eighth transistor M8 may alternatively be N-type transistors, which is not limited in the present disclosure.

If the seventh transistor M7 and the eighth transistor M8 are both P-type transistors, the seventh transistor M7 transmitting the second power signal VGL to the first node N1 in response to the fourth drive signal S2-p includes: the seventh transistor M7 being turned on when the fourth drive signal S2-p is at a low level, and the second power signal VGL being inputted through the first terminal of the turned-on seventh transistor M7 and transmitted to the first node N1 through the turned-on seventh transistor M7, and the signal of the first node N1 is the second power signal VGL, and controlling the signal of the first node N1.

The eighth transistor M8 transmitting the first power signal VGH to the third node N3 in response to the fourth drive signal S2-p includes: the eighth transistor M8 being turned on when the fourth drive signal S2-p is at a low level, and the first power signal VGH being inputted through the first terminal of the eighth transistor M8 and transmitted to the third node N3 through the turned-on eighth transistor M8. Since the third node N3 is connected to the second node N2, the first power signal VGH is transmitted to the second node N2 through the third node N3. Thus the signal of the second node N2 is the first power signal VGH, and the signal of the second node N2 is controlled.

Figure 6:
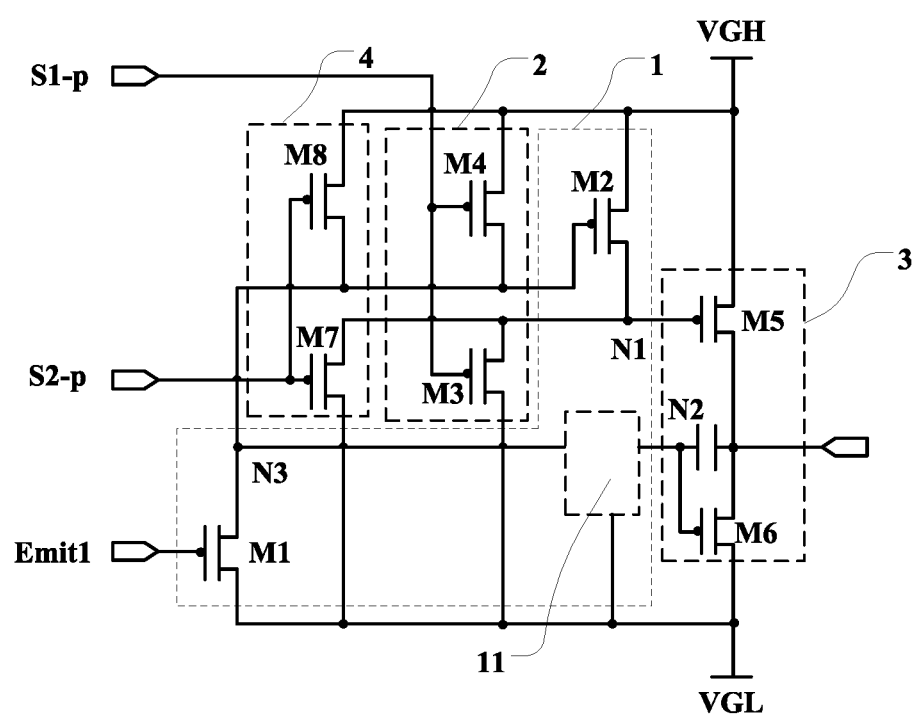
FIG. 6 is a schematic diagram of a circuit structure of a shift register according to an embodiment of the present disclosure.

On the basis of the foregoing embodiments, in another embodiment of the present disclosure, a shift register is provided. Reference is made to FIG. 6, which is a schematic diagram of a circuit structure of the shift register according to the embodiment of the present disclosure. The first control device 1 further includes a stabilization device 11. The third node N3 is connected to the second node N2 through the stabilization device 11.

The stabilization device 11 is configured to stabilize a potential of the second node N2.

In this embodiment, the potential of the second node N2 may be stabilized to the potential of the first power signal VGH or the potential of the second power signal VGL due to the stabilization device 11, and wrong response of the output device 3 due to fluctuations of the potential of the second node N2 is avoided, and avoiding a wrong third drive signal S-n outputted by the output device 3, and avoiding the third drive signal S-n mixed with noise outputted by the output device 3 due to fluctuations of the potential of the second node N2.

Figure 7:
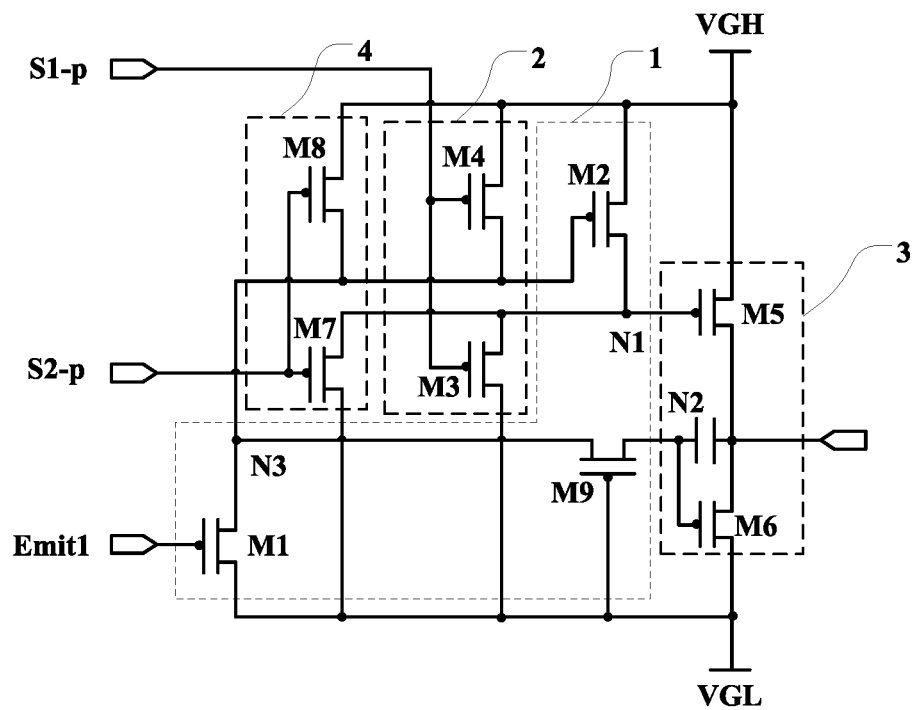
FIG. 7 is a schematic diagram of a circuit structure of a shift register according to an embodiment of the present disclosure.

For a feasible structure of the stabilization device 11, reference is made to FIG. 7, which is a schematic diagram of a circuit structure of the shift register. The stabilization device 11 includes a ninth transistor M9. A first terminal of the ninth transistor M9 is connected to the third node N3, a second terminal of the ninth transistor M9 is connected to the second node N2, and a control terminal of the ninth transistor M9 is connected to the second power signal VGL.

In this embodiment, the stabilization device 11 functions to stabilize the potential of the second node N2 through only one transistor. Thus, the structure of the device is simple, which is beneficial to simplify the overall circuit structure of the shift register.

Figure 8:
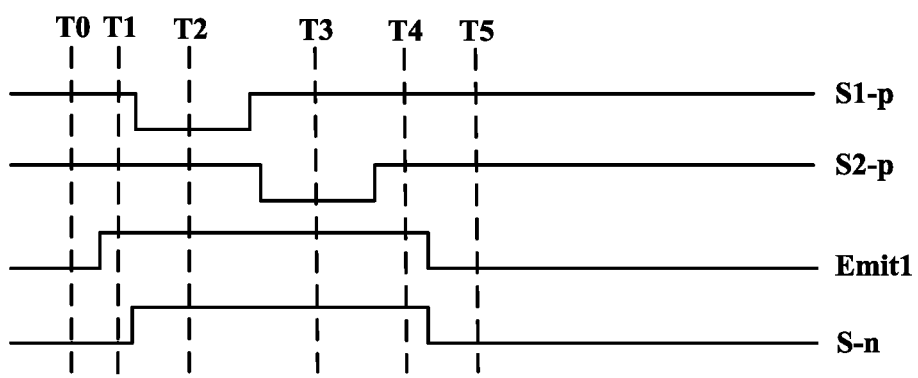
FIG. 8 is a schematic diagram of a timing relationship of a first drive signal, a second drive signal, a third drive signal and a fourth drive signal according to an embodiment of the present disclosure.

Taking the shift register shown in FIG. 7 as an example, a timing relationship of the first drive signal Emit1, the second drive signal S1-p, the third drive signal S-n, and the fourth drive signal S2-p is explained in conjunction with FIG. 8, which is a schematic diagram of a timing relationship of the first drive signal Emit1, the second drive signal S1-p, the third drive signal S-n and the fourth drive signal S2-p according to an embodiment of the present disclosure.

In T0 stage, the sixth transistor M6, the first transistor M1, the second transistor M2, the fifth transistor M5, and the ninth transistor M9 are turned on, and the other transistors are turned off. The signal of the first node N1 is the second power signal VGL (which is represented by a low-level signal below), the signal of the second node N2 is the first power signal VGH (which is represented by a high-level signal below), and the third drive signal S-n is a low-level signal.

In T1 stage, the sixth transistor M6, the second transistor M2, and the ninth transistor M9 are turned on, and the other transistors are turned off. The signal of the first node N1 is at a low level, the signal of the second node N2 is at a high level, and the third drive signal S-n is at a low level.

In T2 stage, the fifth transistor M5, the third transistor M3, the fourth transistor M4, and the ninth transistor M9 are turned on, and the other transistors are turned off. The signal of the third node N3 is at a high level, the signal of the first node N1 is at a high level, the signal of the second node N2 is at a low level, and the third drive signal S-n is at a high level.

In T3 stage, the fifth transistor M5, the seventh transistor M7, the eighth transistor M8, and the ninth transistor M9 are turned on, and the other transistors are turned off. The signal of the third node N3 is at a high level, the signal of the first node N1 is at a high level, the signal of the second node N2 is at a low level, and the third drive signal S-n is at a high level.

In T4 stage, only the fifth transistor M5 and the ninth transistor M9 are turned on, and the other transistors are turned off. At this time, the signal of the third node N3 is at a high level, the signal of the first node N1 is at a high level, the signal of the second node N2 is at a low level, and the third drive signal S-n is maintained at a high level.

In T5 stage, the first transistor M1, the second transistor M2, the ninth transistor M9, and the sixth transistor M6 are turned on, and the other transistors are turned off. The signal of the first node N1 is at a low level, the signal of the second node N2 is at a high-level, and the third drive signal S-n is at a low-level.

Figure 9:
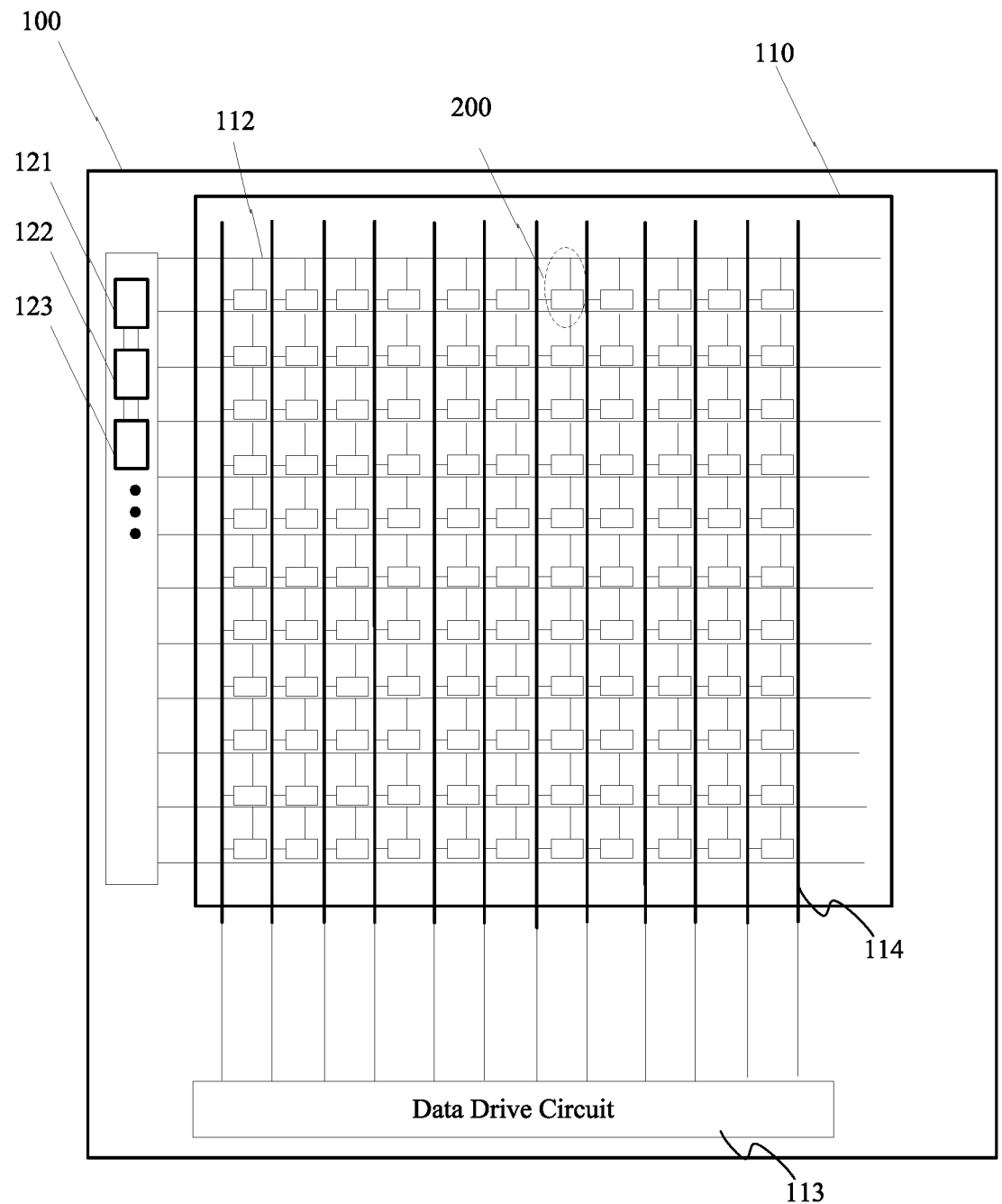
FIG. 9 is a schematic structural diagram of a display device according to an embodiment of the present disclosure.

Correspondingly, a display device is provided according to an embodiment of the present disclosure. Reference is made to FIG. 9, which is a schematic structural diagram of a display device according to an embodiment of the present disclosure. The display device 100 includes a pixel circuit 200.

The pixel circuit 200 is configured to provide a display drive signal for a pixel unit of a display panel. The pixel circuit 200 is connected to a first drive circuit 121, a second drive circuit 122, a third drive circuit 123, and a fourth drive circuit 124. The first drive circuit 121 is configured to provide a light-emitting control signal for the pixel circuit 200. The second drive circuit 122 is configured to provide a first gate drive signal for the pixel circuit 200. The third drive circuit 123 is configured to provide a second gate drive signal for the pixel circuit 200.

The third drive circuit 123 includes: a first control device 1, a second control device 2 and an output device 3.

The first control device 1 is configured to: receive a first power signal VGH and a second power signal VGL, and control a signal of a first node N1 and a signal of a second node N2 in response to the light-emitting control signal.

The second control device 2 is configured to: receive the first power signal VGH and the second power signal VGL, and control the signal of the first node N1 in response to the second gate drive signal.

The output device 3 is configured to: receive the first power signal VGH and the second power signal VGL, and output the second gate drive signal through an output terminal in response to the signal of the first node N1 or the signal of the second node N2.

FIG. 9 further shows a display area 110 of the display device, a data drive circuit 113, a gate line 112, and a data line 114.

Generally, the light-emitting control signal is used to control a light-emitting control device of the pixel circuit 200 to work in a light-emitting phase. The first gate drive signal and the second gate drive signal are used to control a data writing device, a compensation device, a driver device and an initialization device of the pixel circuit 200 to work in a reset phase, a compensation phase and a data signal writing phase.

The light-emitting control signal corresponds to the aforementioned first drive signal Emit1, the first gate drive signal corresponds to the aforementioned second drive signal S1-p, and the second gate drive signal corresponds to the aforementioned third drive signal S-n.

The first drive signal Emit1 includes a periodic signal formed by arranging a high level and a low level according to a duration and an order. Similarly, the second drive signal S1-p includes a periodic signal formed by arranging a high level and a low level according to a duration and an order. The first drive signal Emit1 has a different timing sequence from the second drive signal S1-p. Reference is made to FIG. 2, which is a schematic diagram of a feasible timing relationship of the first drive signal Emit1, the second drive signal S1-p and the third drive signal S-n. As shown in FIG. 2, the shift register is controlled in response to the first drive signal Emit1 and the second drive signal S1-p through the cooperation of the first control device 1, the second control device 2 and the output device 3, to output the third drive signal S-n having another timing sequence. The circuit structure of the shift register is simplified, the size of the shift register for generating the third drive signal S-n is reduced, and reducing the frame area occupied by the gate drive circuit of the shift register, and realizing the "narrow bezel".

It should be noted that, the first control device 1 controlling the signal of the first node N1 and the signal of the second node N2 in response to the first drive signal Emit1 may refer to: when the first drive signal Emit1 is at a low level or a high level, the signal of the first node N1 is controlled to be at a high level or at a low level, and the signal of the second node N2 is controlled to be at a high level or at a low level. Similarly, the second control device 2 controlling the signal of the first node N1 in response to the second drive signal S1-p may refer to: when the second drive signal S1-p is at a low level or a high level, the signal of the first node N1 is controlled to be at a high level or at a low level. The logic of the first control device 1 responding to the first drive signal Emit1 and the logic of the second control device 2 responding to the second drive signal S1-p are not limited in the present disclosure, as long as the timing relationship between the first drive signal Emit1 and the second drive signal S1-p is adapted to the logic of the first control device 1 responding to the first drive signal Emit1 and the logic of the second control device 2 responding to the second drive signal S1-p, to avoid a conflict generated when the first control device 1 and the second control device 2 control the signal of the first node N1 at the same time, that is, the first control device 1 controls the signal of the first node N1 to be at a high level, while the second control device 2 controls the signal of the first node N1 to be at a low level; or the first control device 1 controls the signal of the first node N1 to be at a low level, while the second control device 2 controls the signal of the first node N1 to be at a high level.

The output device 3 outputting the third drive signal S-n through the output terminal in response to the signal of the first node N1 or the signal of the second node N2 may refer to: when the signal of the first node N1 is at a low level and the signal of the second node N2 is at a high level, the third drive signal S-n at a high level is outputted through the output terminal; or when the signal of the first node N1 is at a high level and the signal of the second node N2 is at a low level, the third drive signal S-n at a low level is outputted through the output terminal.

The output device 3 outputting the third drive signal S-n through the output terminal in response to the signal of the first node N1 or the signal of the second node N2 may refer to: when the signal of the first node N1 is at a high level and the signal of the second node N2 is at a low level, the third drive signal S-n at a high level is outputted through the output terminal; or when the signal of the first node N1 is at a low level and the signal of the second node N2 is at a high level, the third drive signal S-n at a low level is outputted through the output terminal.

The feasible structure and control logic of the first control device 1, the second control device 2 and the output device 3 are described as follows.

Reference is made to FIG. 3, which is a schematic diagram of a circuit structure of a shift register according to an embodiment of the present disclosure. As shown in FIG. 3, the first control device 1 further includes a third node N3 connected to the second node N2.

As shown in FIG. 3, the third node N3 is connected to the second node N2. When the first control device 1 is turned on in response to the first drive signal, the second power signal VGL is transmitted to the second node N2 through the third node N3, to control the signal of the second node N2.

Referring to FIG. 3, the first control device 1 includes a first transistor M1 and a second transistor M2. The first transistor M1 is configured to transmit the second power signal VGL to the third node N3 in response to the first drive signal Emit1.

The second transistor M2 is configured to transmit the first power signal VGH to the first node N1 in response to the first drive signal Emit1.

In this embodiment, the first control device 1 functions to control the signal of the first node N1 and the signal of the third node N3 through only the two transistors. Thus, the structure of the device is simple, which is beneficial to simplifying the overall circuit structure of the shift register.

Referring to FIG. 3, a connection relationship of the first transistor M1 and the second transistor M2 is described as follows.

A first terminal of the first transistor M1 is connected to the second power signal VGL, a second terminal of the first transistor M1 is connected to the third node N3, and a control terminal of the first transistor M1 is connected to the first drive signal Emit1.

A first terminal of the second transistor M2 is connected to the first power signal VGH, a second terminal of the second transistor M2 is connected to the first node N1, and a control terminal of the second transistor M2 is connected to the first drive signal Emit1.

In FIG. 3, the first transistor M1 and the second transistor M2 both being P-type transistors are described as an example for illustration. In other embodiments of the present disclosure, the first transistor M1 and the second transistor M2 may alternatively be N-type transistors, which is not limited in the present disclosure.

If the first transistor M1 and the second transistor M2 are both P-type transistors, the first transistor M1 transmitting the second power signal VGL to the third node N3 in response to the first drive signal Emit1 includes: the first transistor M1 being turned on when the first drive signal Emit1 is at a low level, and the second power signal VGL being inputted through the first terminal of the first transistor M1 and transmitted to the third node N3 through the turned-on first transistor M1. Since the third node N3 is connected to the second node N2, the second power signal VGL is transmitted to the second node N2 through the third node N3, and the signal of the second node N2 is the second power signal VGL, and controlling the signal of the second node N2.

Similarly, the second transistor M2 transmitting the first power signal VGH to the first node N1 in response to the first drive signal Emit1 includes: when the first transistor M1 is turned on in response to the first drive signal Emit1, the second transistor M2 receiving the second power signal VGL through the control terminal and being turned on, and the first power signal VGH being transmitted to the first node N1 through the turned-on second transistor M2, and the signal of the first node N1 is the first power signal VGH, and controlling the signal of the first node N1.

Referring to FIG. 3, the second control device 2 includes a third transistor M3 and a fourth transistor M4. The third transistor M3 is configured to transmit the second power signal VGL to the first node N1 in response to the second drive signal S1-$p$. The fourth transistor M4 is configured to transmit the first power signal VGH to the third node N3 in response to the second drive signal S1-$p$.

In this embodiment, the second control device 2 functions to control the signal of the first node N1 through only the two transistors. Thus, the structure of the device is simple, which is beneficial to simplifying the overall circuit structure of the shift register. In addition, the signal of the third node N3 is also controlled by the second control device 2, and avoiding the output device 3 outputting wrong signals due to the signal of the first node N1 and the signal of the third node N3 (or the signal of the second node N2) being the same.

Referring to FIG. 3, a connection relationship of the third transistor M3 and the fourth transistor M4 is described as follows.

A first terminal of the third transistor M3 is connected to the second power signal VGL, a second terminal of the third transistor M3 is connected to the first node N1, and a control terminal of the third transistor M3 is connected to the second drive signal S1-$p$.

A first terminal of the fourth transistor M4 is connected to the first power signal VGH, a second terminal of the fourth transistor M4 is connected to the third node N3, and a control terminal of the fourth transistor M4 is connected to the second drive signal S1-$p$.

In FIG. 3, the third transistor M3 and the fourth transistor M4 both being P-type transistors are described as an example for illustration. In other embodiments of the present disclosure, the third transistor M3 and the fourth transistor M4 may alternatively be N-type transistors, which is not limited in the present disclosure.

If the third transistor M3 and the fourth transistor M4 are both P-type transistors, the third transistor M3 transmitting the second power signal VGL to the first node N1 in response to the second drive signal S1-$p$ includes: the third transistor M3 being turned on when the second drive signal S1-$p$ is at a low level, and the second power signal VGL being inputted through the first terminal of the third transistor M3 and transmitted to the first node N1 through the turned-on third transistor M3, and the signal of the first node N1 is the second power signal VGL, and controlling the signal of the first node N1.

The fourth transistor M4 transmitting the first power signal VGH to the third node N3 in response to the second drive signal S1-$p$ includes: the fourth transistor M4 being turned on when the second drive signal S1-$p$ is at a low level, and the first power signal VGH being inputted through the first terminal of the fourth transistor M4 and transmitted to the third node N3 through the turned-on fourth transistor M4. Since the third node N3 is connected to the second node N2, the first power signal VGH is transmitted to the second node N2 through the third node N3, and the signal of the second node N2 is the first power signal VGH, and avoiding the output device 3 outputting a wrong signal since the signal of the first node N1 and the signal of the second node N2 are the same power signal at the same time.

Referring to FIG. 3, the output device 3 includes a fifth transistor M5 and a sixth transistor M6. The fifth transistor M5 is configured to transmit the first power signal VGH to the output terminal in response to the signal of the first node N1.

The sixth transistor M6 is configured to transmit the second power signal VGL to the output terminal in response to the signal of the second node N2.

Generally, the first power signal VGH is a high-level signal, and the second power signal VGL is a low-level signal. When the fifth transistor M5 transmits the first power signal VGH to the output terminal in response to the signal of the first node N1, the third drive signal S-n is at a high level. When the sixth transistor M6 transmits the second power signal VGL to the output terminal in response to the signal of the second node N2, the third drive signal S-n is at a low level.

In this embodiment, the output device 3 functions to output the third drive signal S-n in response to the signal of the first node N1 or the signal of the second node N2 through only the two transistors. Thus, the structure of the device is simple, which is beneficial to simplifying the overall circuit structure of the shift register.

Referring to FIG. 3, a connection relationship of the fifth transistor M5 and the sixth transistor M6 is described as follows.

A first terminal of the fifth transistor M5 is connected to the first power signal VGH, a second terminal of the fifth transistor M5 is connected to the output terminal, and a control terminal of the fifth transistor M5 is connected to the first node N1.

A first terminal of the sixth transistor M6 is connected to the second power signal VGL, a second terminal of the sixth transistor M6 is connected to the output terminal, and a control terminal of the sixth transistor M6 is connected to the second node N2.

In FIG. 3, the fifth transistor M5 and the sixth transistor M6 both being P-type transistors are described as an example for illustration. In other embodiments of the present disclosure, the fifth transistor M5 and the sixth transistor M6 may alternatively be N-type transistors, which is not limited by the present disclosure.

If the fifth transistor M5 and the sixth transistor M6 are both P-type transistors, the fifth transistor M5 transmitting the first power signal VGH to the output terminal in response to the signal of the first node N1 includes: the fifth transistor M5 being turned on when the signal of the first node N1 is at a low level, and the first power signal VGH being inputted through the first terminal of the fifth transistor M5 and transmitted to the output terminal through the turned-on fifth transistor M5.

The sixth transistor M6 transmitting the second power signal VGL to the output terminal in response to the signal of the second node N2 includes: the sixth transistor M6 being turned on when the signal of the second node N2 is at a low level, and the second power signal VGL being inputted through the first terminal of the sixth transistor M6 and transmitted to the output terminal through the turned-on sixth transistor M6.

Taking the shift register shown in FIG. 3 as an example, in combination with FIG. 2, it can be seen that, only when the first drive signal Emit1 is at a high level and the second drive signal S1-*p* is at a low level, the shift register outputs a high-level third drive signal S-n. When the first drive signal Emit1 and the second drive signal S1-*p* are other signal combinations, the shift register outputs a low-level third drive signal S-n.

Figure 10:
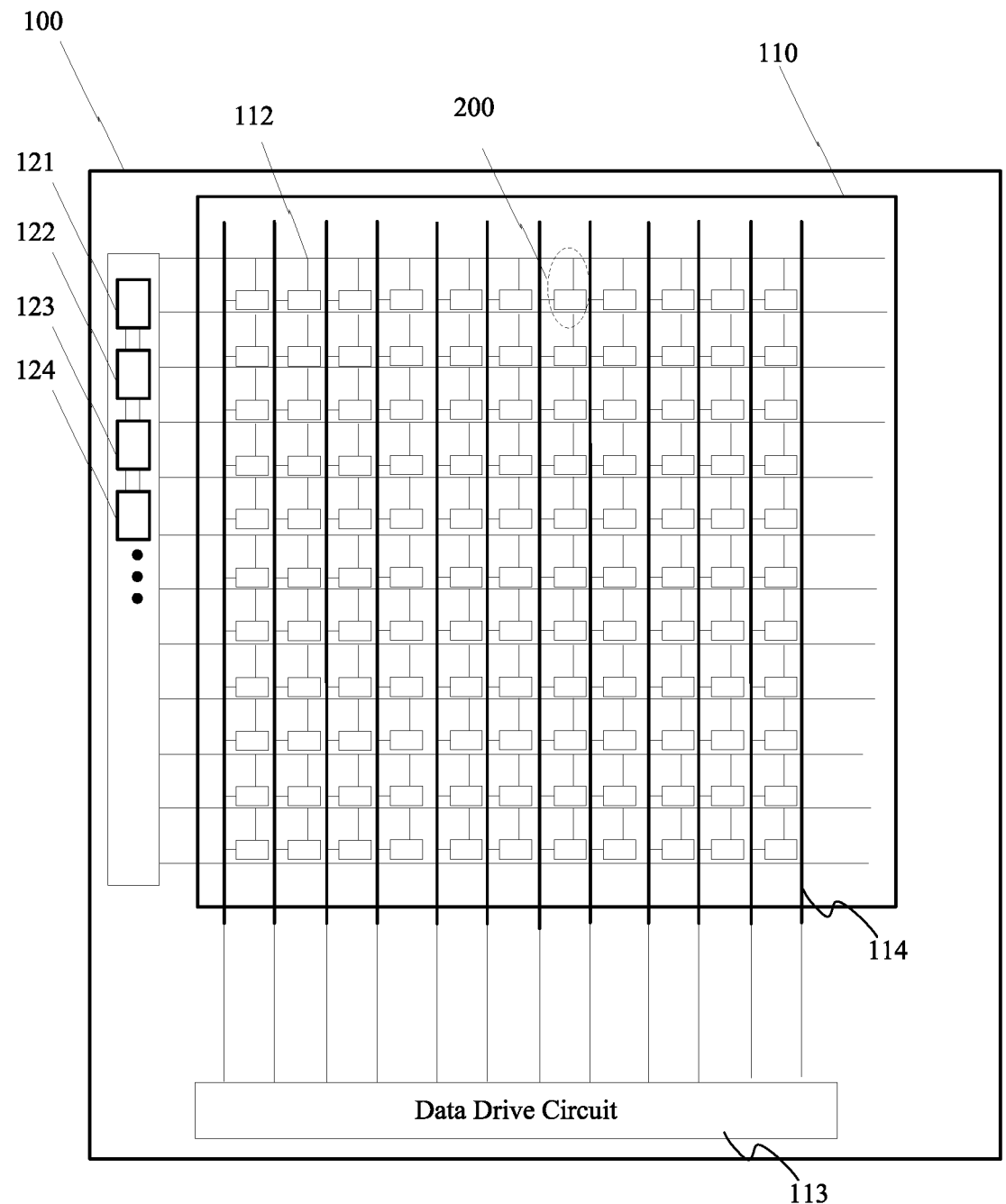
FIG. 10 is a schematic structural diagram of a display device according to an embodiment of the present disclosure.

On the basis of the foregoing embodiments, in another embodiment of the present disclosure, a display device is provided. Reference is made to FIG. 10, which is a schematic structural diagram of a display device 100. The display device 100 further includes a fourth drive circuit 124. The fourth drive circuit 124 is configured to provide a third gate drive signal for the pixel circuit 200.

Referring to FIG. 4, the third drive circuit 123 further includes a third control device 4.

The third control device 4 is configured to: receive the first power signal VGH and the second power signal VGL, and control the signal of the first node N1 in response to the third gate drive signal.

The third gate drive signal corresponds to the aforementioned fourth drive signal S2-*p*, and the first gate drive signal, the second gate drive signal, the third gate drive signal and the light-emitting control signal cooperate with each other, to realize emit dimming function of the pixel circuit 200. The emit dimming function includes, but is not limited to, PWM (Pulse Width Modulation) dimming and DC (Direct-Current) dimming.

In this embodiment, the signal of the first node N1 is controlled through the cooperation of the third control device 4 and the fourth drive signal S2-*p*. Thus, the control logic of the shift register is more diversified. That is, a third control signal outputted by the shift register has more diversified timing sequences based on the cooperation of the first control signal, the second control signal and the fourth control signal, and satisfying requirements of different gate drive circuits.

FIG. 4 further shows a first capacitor C1 of the output device 3. One terminal of the first capacitor C1 is connected to the second node N2, and the other terminal of the first capacitor C1 is connected to the output terminal. The first capacitor C1 is configured to maintain a potential of the second node N2.

For a specific structure of the third control device 4, reference is made to FIG. 5, which is a schematic diagram of a circuit structure of a shift register according to an embodiment of the present disclosure. The third control device 4 includes: a seventh transistor M7 and an eighth transistor M8.

The seventh transistor M7 is configured to transmit the second power signal VGL to the first node N1 in response to the fourth drive signal S2-*p*.

The eighth transistor M8 is configured to transmit the first power signal VGH to the third node N3 in response to the fourth drive signal S2-*p*.

In this embodiment, the third control device 4 functions to control the signal of the first node N1 through only the two transistors. Thus, the structure of the device is simple, which is beneficial to simplify the overall circuit structure of the shift register. In addition, the signal of the third node N3 is also controlled by the third control device 4, and avoiding the output device 3 outputting wrong signals due to the signal of the first node N1 and the signal of the third node N3 (or the signal of the second node N2) being the same.

Referring to FIG. 5, a connection relationship of the seventh transistor M7 and the eighth transistor M8 is described specifically as follows.

A first terminal of the seventh transistor M7 is connected to the second power signal VGL, a second terminal of the seventh transistor M7 is connected to the first node N1, and a control terminal of the seventh transistor M7 is connected to the fourth drive signal S2-*p*.

A first terminal of the eighth transistor M8 is connected to the first power signal VGH, a second terminal of the eighth transistor M8 is connected to the third node N3, and a control terminal of the eighth transistor M8 is connected to the fourth drive signal S2-*p*.

In FIG. 5, the seventh transistor M7 and the eighth transistor M8 both being P-type transistors are described as an example for illustration. In other embodiments of the present disclosure, the seventh transistor M7 and the eighth transistor M8 may alternatively be N-type transistors, which is not limited in the present disclosure.

If the seventh transistor M7 and the eighth transistor M8 are both P-type transistors, the seventh transistor M7 transmitting the second power signal VGL to the first node N1 in response to the fourth drive signal S2-*p* includes: the seventh transistor M7 being turned on when the fourth drive signal S2-*p* is at a low level, and the second power signal VGL being inputted through the first terminal of the turned-on seventh transistor M7 and transmitted to the first node N1 through the turned-on seventh transistor M7, and the signal of the first node N1 is the second power signal VGL, and controlling the signal of the first node N1.

The eighth transistor M8 transmitting the first power signal VGH to the third node N3 in response to the fourth drive signal S2-*p* includes: the eighth transistor M8 being turned on when the fourth drive signal S2-*p* is at a low level, and the first power signal VGH being inputted through the first terminal of the eighth transistor M8 and transmitted to the third node N3 through the turned-on eighth transistor M8. Since the third node N3 is connected to the second node N2, the first power signal VGH is transmitted to the second node N2 through the third node N3. Thus the signal of the second node N2 is the first power signal VGH, and the signal of the second node N2 is controlled.

On the basis of the foregoing embodiments, in another embodiment of the present disclosure, a shift register is provided. Reference is made to FIG. 6, which is a schematic diagram of a circuit structure of the shift register according to the embodiment of the present disclosure. The first control device 1 further includes a stabilization device 11. The third node N3 is connected to the second node N2 through the stabilization device 11.

The stabilization device 11 is configured to stabilize a potential of the second node N2.

In this embodiment, the potential of the second node N2 may be stabilized to the potential of the first power signal VGH or the potential of the second power signal VGL due to the stabilization device 11, and wrong response of the output device 3 due to fluctuations of the potential of the second node N2 is avoided, and avoiding a wrong third drive signal S-n outputted by the output device 3, and avoiding the third drive signal S-n mixed with noise outputted by the output device 3 due to fluctuations of the potential of the second node N2.

For a feasible structure of the stabilization device 11, reference is made to FIG. 7, which is a schematic diagram of a circuit structure of the shift register. The stabilization device 11 includes a ninth transistor M9. A first terminal of the ninth transistor M9 is connected to the third node N3, a second terminal of the ninth transistor M9 is connected to the second node N2, and a control terminal of the ninth transistor M9 is connected to the second power signal VGL.

In this embodiment, the potential of the second node N2 is stabilized through only one transistor of the stabilization device 11. Thus, the structure of the device is simple, which is beneficial to simplify the overall circuit structure of the shift register.

Taking the shift register shown in FIG. 7 as an example, a timing relationship of the first drive signal Emit1, the second drive signal S1-$p$, the third drive signal S-$n$, and the fourth drive signal S2-$p$ is explained in conjunction with FIG. 8, which is a schematic diagram of a timing relationship of the first drive signal Emit1, the second drive signal S1-$p$, the third drive signal S-$n$ and the fourth drive signal S2-$p$ according to an embodiment of the present disclosure.

In T0 stage, the sixth transistor M6, the first transistor M1, the second transistor M2, the fifth transistor M5, and the ninth transistor M9 are turned on, and the other transistors are turned off. The signal of the first node N1 is the second power signal VGL (which is represented by a low-level signal below), the signal of the second node N2 is the first power signal VGH (which is represented by a high-level signal below), and the third drive signal S-$n$ is a low-level signal.

In T1 stage, the sixth transistor M6, the second transistor M2, and the ninth transistor M9 are turned on, and the other transistors are turned off. The signal of the first node N1 is at a low level, the signal of the second node N2 is at a high level, and the third drive signal S-$n$ is at a low level.

In T2 stage, the fifth transistor M5, the third transistor M3, the fourth transistor M4, and the ninth transistor M9 are turned on, and the other transistors are turned off. The signal of the third node N3 is at a high level, the signal of the first node N1 is at a high level, the signal of the second node N2 is at a low level, and the third drive signal S-$n$ is at a high level.

In T3 stage, the fifth transistor M5, the seventh transistor M7, the eighth transistor M8, and the ninth transistor M9 are turned on, and the other transistors are turned off. The signal of the third node N3 is at a high level, the signal of the first node N1 is at a high level, the signal of the second node N2 is at a low level, and the third drive signal S-$n$ is at a high level.

In T4 stage, only the fifth transistor M5 and the ninth transistor M9 are turned on, and the other transistors are turned off. At this time, the signal of the third node N3 is at a high level, the signal of the first node N1 is at a high level, the signal of the second node N2 is at a low level, and the third drive signal S-$n$ is maintained at a high level.

In T5 stage, the first transistor M1, the second transistor M2, the ninth transistor M9, and the sixth transistor M6 are turned on, and the other transistors are turned off. The signal of the first node N1 is at a low level, the signal of the second node N2 is at a high-level, and the third drive signal S-$n$ is at a low-level.

Figure 11:
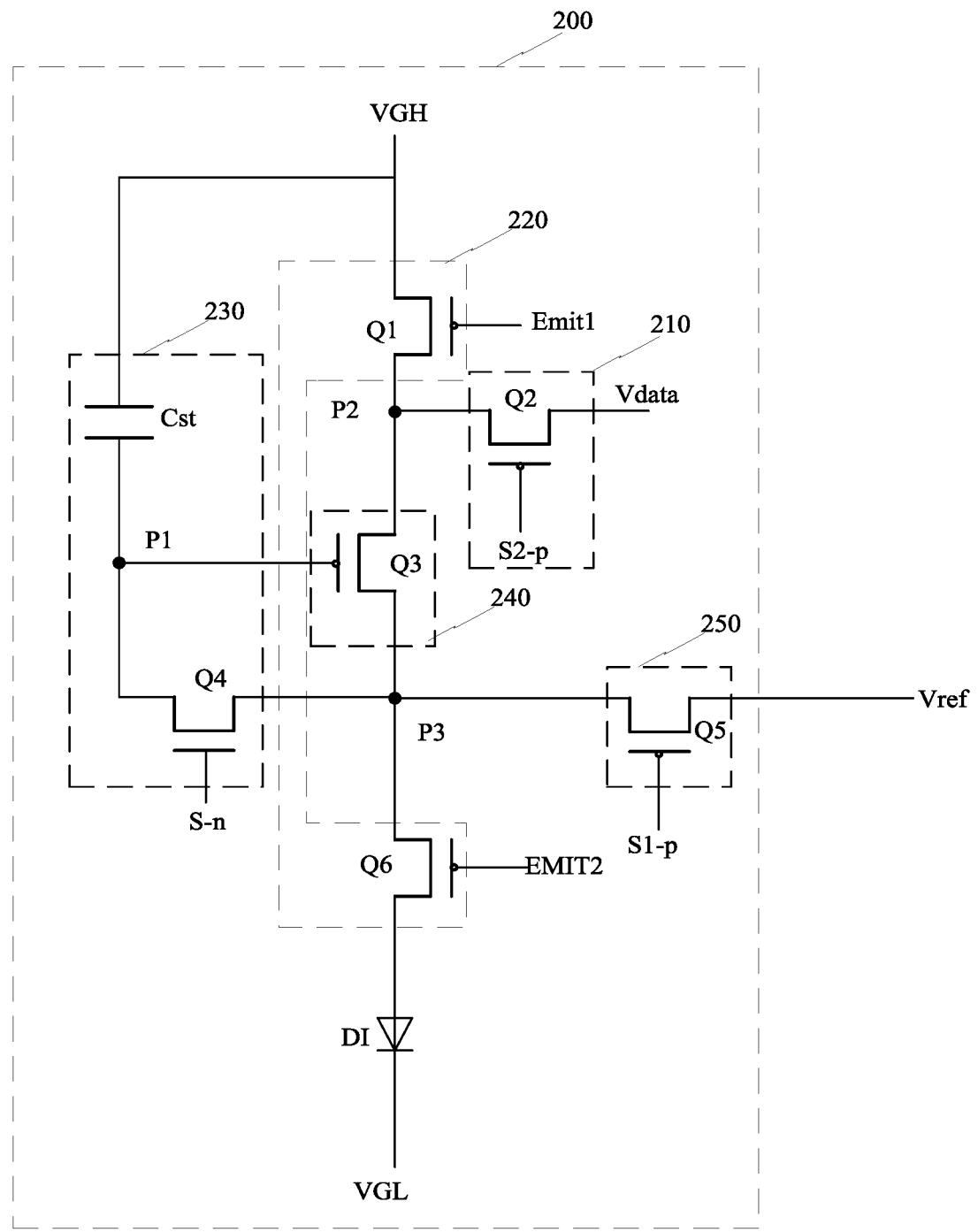
FIG. 11 is a schematic structural diagram of a pixel circuit according to an embodiment of the present disclosure.

On the basis of the foregoing embodiment, in an embodiment of the present application, reference is made to FIG. 11, which is a schematic structural diagram of a pixel circuit 200. The pixel circuit 200 includes: a data writing device 210, a compensation device 230, a driver device 240, a light-emitting control device 220 and an initialization device 250. The light-emitting control signal is used to control the light-emitting control device 220. The first gate drive signal S1-$p$ is used to control the initialization device 250. The second gate drive signal S-$n$ is used to control the compensation device 230. The third gate drive signal S2-$p$ is used to control the data writing device 210.

Referring to FIG. 11, the data writing device includes an eleventh transistor Q2. A first terminal of the eleventh transistor Q2 is used to receive a data signal Vdata, and a control terminal of the eleventh transistor Q2 is connected to the third gate drive signal S2-$p$. A second terminal of the eleventh transistor is connected to a fifth node P2.

The driver device 240 includes a twelfth transistor Q3. A first terminal of the twelfth transistor Q3 is connected to the fifth node P2, a control terminal of the twelfth transistor Q3 is connected to a fourth node P1, and a second terminal of the twelfth transistor Q3 is connected to both the initialization device 250 and the compensation device 230.

The light-emitting control device 220 includes a tenth transistor Q1 and a fifteenth transistor Q6. A first terminal of the tenth transistor Q1 is used to receive the first power signal VGH, a control terminal of the tenth transistor Q1 is used to receive the light-emitting control signal, and a second terminal of the tenth transistor is connected to the fifth node P2. A first terminal of the fifteenth transistor Q6 is connected to the second terminal of the twelfth transistor Q3, a control terminal of the fifteenth transistor Q6 is used to receive the light-emitting control signal, and a second terminal of the fifteenth transistor Q6 is connected to an anode of a light-emitting unit.

The compensation device 230 includes a thirteenth transistor Q4 and a second capacitor Cst. A control terminal of the thirteenth transistor Q4 is used to receive the second gate drive signal S-$n$. A first terminal of the thirteenth transistor Q4 is connected to the second terminal of the twelfth transistor Q3 and the first terminal of the fifteenth transistor Q6. A second terminal of the thirteenth transistor Q4 is connected to the fourth node P1. One terminal of the second capacitor is connected to the fourth node P1, and the other terminal of the second capacitor Cst is connected to the first terminal of the tenth transistor Q1.

The initialization device 250 includes a fourteenth transistor Q5. A control terminal of the fourteenth transistor Q5 is used to receive the first gate drive signal S1-$p$. A first terminal of the fourteenth transistor Q5 is used to receive a reference signal Vref A second terminal of the fourteenth transistor Q5 is connected to the second terminal of the twelfth transistor Q3.

A working process of the pixel circuit 200 shown in FIG. 11 is briefly described as follows.

Figure 12:
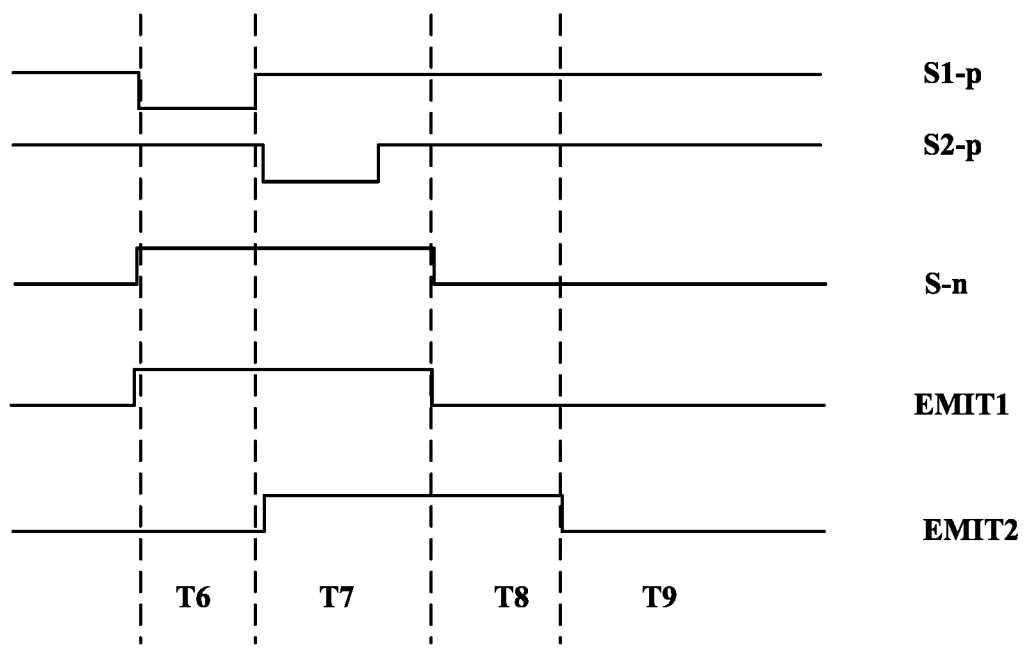
FIG. 12 is a schematic diagram of a timing relationship of a first gate drive signal, a second gate drive signal, a third gate drive signal and a light-emitting control signal according to an embodiment of the present disclosure.

Reference is made to FIG. 12, which is a schematic diagram of a timing relationship of a first gate drive signal S1-$p$, a second gate drive signal S-$n$, a third gate drive signal S2-$p$ and a light-emitting control signal. The light-emitting control signal includes a first control signal EMIT1 and a second control signal EMIT2. EMIT1 is a light-emitting control signal provided by a first drive circuit 121 corresponding to a pixel circuit 200 of a current row. EMIT2 is a light-emitting control signal provided by a first driving circuit 121 corresponding to a pixel circuit 200 of a next row.

In T6 period, the fourteenth transistor Q5 and the fifteenth transistor Q6 are turned on, and the other transistors are turned off. The reference signal Vref is written to the sixth node P3 and the anode of the light-emitting unit DI, to release residual charges of the sixth node P3 and the anode of the light-emitting unit DI during a previous light-emitting process, and resetting the pixel circuit 200.

In T7 period, the eleventh transistor Q2 is turned on, and the other transistors are turned off. The data signal Vdata is written to the fifth node P2 through the data writing device 210.

In T8 period, the thirteenth transistor Q4 and the tenth transistor Q1 are turned on. The potential of the sixth node P3 is transferred to the fourth node P1. The twelfth transistor Q3 is turned on. The data signal Vdata is written to the fourth node P1.

In T9 period, the fifteenth transistor Q5, the twelfth transistor Q3, and the tenth transistor Q1 are turned on. The light-emitting unit DI emits light.

In an embodiment, the pixel circuit 200 includes at least one oxide semiconductor transistor and at least one poly-silicon transistor.

The oxide semiconductor transistor includes, but is not limited to, an Indium Gallium Zinc Oxide (IGZO) transistor. The oxide semiconductor transistor has advantages of high switching frequency and high carrier mobility, which increase the charge and discharge rate of display pixels, and increase the response speed of display pixels, and realizing a higher refresh rate. The poly-silicon transistor includes, but is not limited to, a Low Temperature Poly-Silicon (LTPS) transistor. The low temperature poly-silicon transistor has advantages of a small size, low power consumption, and high technical maturity.

In an embodiment, at least the compensation device includes an oxide semiconductor transistor.

Correspondingly, a display device 100 is provided according to an embodiment of the present disclosure.

Referring to FIG. 10, the display device 100 includes a pixel circuit 200. The pixel circuit 200 is configured to provide a display drive signal for a pixel unit of a display panel. The pixel circuit 200 is connected to a first drive circuit 121, a second drive circuit 122, a third drive circuit 123, and a fourth drive circuit 124. The first drive circuit 121 is configured to provide a light-emitting control signal for the pixel circuit 200. The second drive circuit 122 is configured to provide a first gate drive signal for the pixel circuit 200. The third drive circuit 123 is configured to provide a second gate drive signal for the pixel circuit 200.

The third drive circuit 123 is configured to: receive a first power signal VGH and a second power signal VGL, and output the second gate drive signal in response to the light-emitting control signal and the first gate drive signal.

In this embodiment, the third drive circuit 123 outputs the second gate drive signal in response to the light-emitting control signal and the first gate drive signal. Compared with a third drive circuit that directly generates the second gate drive signal, the third drive circuit 123 in this embodiment has a simple circuit structure, which is beneficial to reduce the area occupied by the third drive circuit 123, and to realize a narrow bezel of the display device.

Generally, the light-emitting control signal is used to control a light-emitting control device of the pixel circuit 200 to work in a light-emitting phase. The first gate drive signal and the second gate drive signal are used to control a data writing device, a compensation device, a driver device and an initialization device of the pixel circuit 200 to work in a reset phase, a compensation phase and a data signal writing phase.

The light-emitting control signal corresponds to the aforementioned first drive signal Emit1, the first gate drive signal corresponds to the aforementioned second drive signal S1-*p*, and the second gate drive signal corresponds to the aforementioned third drive signal S-n.

The first drive signal Emit1 includes a periodic signal formed by arranging a high level and a low level according to a duration and an order. Similarly, the second drive signal S1-*p* includes a periodic signal formed by arranging a high level and a low level according to a duration and an order.

The first drive signal Emit1 has a different timing sequence from the second drive signal S1-*p*. Reference is made to FIG. 2, which is a schematic diagram of a feasible timing relationship of the first drive signal Emit1, the second drive signal S1-*p* and the third drive signal S-n. As shown in FIG. 2, the shift register is controlled in response to the first drive signal Emit1 and the second drive signal S1-*p* through the cooperation of the first control device 1, the second control device 2 and the output device 3, to output the third drive signal S-n having another timing sequence. The circuit structure of the shift register is simplified, the size of the shift register for generating the third drive signal S-n is reduced, and reducing the frame area occupied by the gate drive circuit of the shift register, and realizing the "narrow bezel".

It should be noted that, the first control device 1 controlling the signal of the first node N1 and the signal of the second node N2 in response to the first drive signal Emit1 may refer to: when the first drive signal Emit1 is at a low level or a high level, the signal of the first node N1 is controlled to be at a high level or at a low level, and the signal of the second node N2 is controlled to be at a high level or at a low level. Similarly, the second control device 2 controlling the signal of the first node N1 in response to the second drive signal S1-*p* may refer to: when the second drive signal S1-*p* is at a low level or a high level, the signal of the first node N1 is controlled to be at a high level or at a low level. The logic of the first control device 1 responding to the first drive signal Emit1 and the logic of the second control device 2 responding to the second drive signal S1-*p* are not limited in the present disclosure, as long as the timing relationship between the first drive signal Emit1 and the second drive signal S1-*p* is adapted to the logic of the first control device 1 responding to the first drive signal Emit1 and the logic of the second control device 2 responding to the second drive signal S1-*p*, to avoid a conflict generated when the first control device 1 and the second control device 2 control the signal of the first node N1 at the same time, that is, the first control device 1 controls the signal of the first node N1 to be at a high level, while the second control device 2 controls the signal of the first node N1 to be at a low level; or the first control device 1 controls the signal of the first node N1 to be at a low level, while the second control device 2 controls the signal of the first node N1 to be at a high level.

The output device 3 outputting the third drive signal S-n through the output terminal in response to the signal of the first node N1 or the signal of the second node N2 may refer to: when the signal of the first node N1 is at a low level and the signal of the second node N2 is at a high level, the third drive signal S-n at a high level is outputted through the output terminal; or when the signal of the first node N1 is at a high level and the signal of the second node N2 is at a low level, the third drive signal S-n at a low level is outputted through the output terminal.

The output device 3 outputting the third drive signal S-n through the output terminal in response to the signal of the first node N1 or the signal of the second node N2 may refer to: when the signal of the first node N1 is at a high level and the signal of the second node N2 is at a low level, the third drive signal S-n at a high level is outputted through the output terminal; or when the signal of the first node N1 is at a low level and the signal of the second node N2 is at a high level, the third drive signal S-n at a low level is outputted through the output terminal.

The feasible structure and control logic of the first control device 1, the second control device 2 and the output device 3 are described as follows.

Reference is made to FIG. 3, which is a schematic diagram of a circuit structure of a shift register according to an embodiment of the present disclosure. As shown in FIG. 3, the first control device 1 further includes a third node N3 connected to the second node N2.

As shown in FIG. 3, the third node N3 is connected to the second node N2. When the first control device 1 is turned on in response to the first drive signal, the second power signal VGL is transmitted to the second node N2 through the third node N3, to control the signal of the second node N2.

Referring to FIG. 3, the first control device 1 includes a first transistor M1 and a second transistor M2. The first transistor M1 is configured to transmit the second power signal VGL to the third node N3 in response to the first drive signal Emit1.

The second transistor M2 is configured to transmit the first power signal VGH to the first node N1 in response to the first drive signal Emit1.

In this embodiment, the first control device 1 functions to control the signal of the first node N1 and the signal of the third node N3 through only the two transistors. Thus, the structure of the device is simple, which is beneficial to simplifying the overall circuit structure of the shift register.

Referring to FIG. 3, a connection relationship of the first transistor M1 and the second transistor M2 is described as follows.

A first terminal of the first transistor M1 is connected to the second power signal VGL, a second terminal of the first transistor M1 is connected to the third node N3, and a control terminal of the first transistor M1 is connected to the first drive signal Emit1.

A first terminal of the second transistor M2 is connected to the first power signal VGH, a second terminal of the second transistor M2 is connected to the first node N1, and a control terminal of the second transistor M2 is connected to the first drive signal Emit1.

In FIG. 3, the first transistor M1 and the second transistor M2 both being P-type transistors are described as an example for illustration. In other embodiments of the present disclosure, the first transistor M1 and the second transistor M2 may alternatively be N-type transistors, which is not limited in the present disclosure.

If the first transistor M1 and the second transistor M2 are both P-type transistors, the first transistor M1 transmitting the second power signal VGL to the third node N3 in response to the first drive signal Emit1 includes: the first transistor M1 being turned on when the first drive signal Emit1 is at a low level, and the second power signal VGL being inputted through the first terminal of the first transistor M1 and transmitted to the third node N3 through the turned-on first transistor M1. Since the third node N3 is connected to the second node N2, the second power signal VGL is transmitted to the second node N2 through the third node N3, and the signal of the second node N2 is the second power signal VGL, and controlling the signal of the second node N2.

Similarly, the second transistor M2 transmitting the first power signal VGH to the first node N1 in response to the first drive signal Emit1 includes: when the first transistor M1 is turned on in response to the first drive signal Emit1, the second transistor M2 receiving the second power signal VGL through the control terminal and being turned on, and the first power signal VGH being transmitted to the first node N1 through the turned-on second transistor M2, and the signal of the first node N1 is the first power signal VGH, and controlling the signal of the first node N1.

Referring to FIG. 3, the second control device 2 includes a third transistor M3 and a fourth transistor M4. The third transistor M3 is configured to transmit the second power signal VGL to the first node N1 in response to the second drive signal S1-p. The fourth transistor M4 is configured to transmit the first power signal VGH to the third node N3 in response to the second drive signal S1-p.

In this embodiment, the second control device 2 functions to control the signal of the first node N1 through only the two transistors. Thus, the structure of the device is simple, which is beneficial to simplifying the overall circuit structure of the shift register. In addition, the signal of the third node N3 is also controlled by the second control device 2, and avoiding the output device 3 outputting wrong signals due to the signal of the first node N1 and the signal of the third node N3 (or the signal of the second node N2) being the same.

Referring to FIG. 3, a connection relationship of the third transistor M3 and the fourth transistor M4 is described as follows.

A first terminal of the third transistor M3 is connected to the second power signal VGL, a second terminal of the third transistor M3 is connected to the first node N1, and a control terminal of the third transistor M3 is connected to the second drive signal S1-p.

A first terminal of the fourth transistor M4 is connected to the first power signal VGH, a second terminal of the fourth transistor M4 is connected to the third node N3, and a control terminal of the fourth transistor M4 is connected to the second drive signal S1-p.

In FIG. 3, the third transistor M3 and the fourth transistor M4 both being P-type transistors are described as an example for illustration. In other embodiments of the present disclosure, the third transistor M3 and the fourth transistor M4 may alternatively be N-type transistors, which is not limited in the present disclosure.

If the third transistor M3 and the fourth transistor M4 are both P-type transistors, the third transistor M3 transmitting the second power signal VGL to the first node N1 in response to the second drive signal S1-p includes: the third transistor M3 being turned on when the second drive signal S1-p is at a low level, and the second power signal VGL being inputted through the first terminal of the third transistor M3 and transmitted to the first node N1 through the turned-on third transistor M3, and the signal of the first node N1 is the second power signal VGL, and controlling the signal of the first node N1.

The fourth transistor M4 transmitting the first power signal VGH to the third node N3 in response to the second drive signal S1-p includes: the fourth transistor M4 being turned on when the second drive signal S1-p is at a low level, and the first power signal VGH being inputted through the first terminal of the fourth transistor M4 and transmitted to the third node N3 through the turned-on fourth transistor M4. Since the third node N3 is connected to the second node N2, the first power signal VGH is transmitted to the second node N2 through the third node N3, and the signal of the second node N2 is the first power signal VGH, and avoiding the output device 3 outputting a wrong signal since the signal of the first node N1 and the signal of the second node N2 are the same power signal at the same time.

Referring to FIG. 3, the output device 3 includes a fifth transistor M5 and a sixth transistor M6. The fifth transistor M5 is configured to transmit the first power signal VGH to the output terminal in response to the signal of the first node N1.

The sixth transistor M6 is configured to transmit the second power signal VGL to the output terminal in response to the signal of the second node N2.

Generally, the first power signal VGH is a high-level signal, and the second power signal VGL is a low-level signal. When the fifth transistor M5 transmits the first power signal VGH to the output terminal in response to the signal of the first node N1, the third drive signal S-n is at a high level. When the sixth transistor M6 transmits the second power signal VGL to the output terminal in response to the signal of the second node N2, the third drive signal S-n is at a low level.

In this embodiment, the output device 3 functions to output the third drive signal S-n in response to the signal of the first node N1 or the signal of the second node N2 through only the two transistors. Thus, the structure of the device is simple, which is beneficial to simplifying the overall circuit structure of the shift register.

Referring to FIG. 3, a connection relationship of the fifth transistor M5 and the sixth transistor M6 is described as follows.

A first terminal of the fifth transistor M5 is connected to the first power signal VGH, a second terminal of the fifth transistor M5 is connected to the output terminal, and a control terminal of the fifth transistor M5 is connected to the first node N1.

A first terminal of the sixth transistor M6 is connected to the second power signal VGL, a second terminal of the sixth transistor M6 is connected to the output terminal, and a control terminal of the sixth transistor M6 is connected to the second node N2.

In FIG. 3, the fifth transistor M5 and the sixth transistor M6 both being P-type transistors are described as an example for illustration. In other embodiments of the present disclosure, the fifth transistor M5 and the sixth transistor M6 may alternatively be N-type transistors, which is not limited by the present disclosure.

If the fifth transistor M5 and the sixth transistor M6 are both P-type transistors, the fifth transistor M5 transmitting the first power signal VGH to the output terminal in response to the signal of the first node N1 includes: the fifth transistor M5 being turned on when the signal of the first node N1 is at a low level, and the first power signal VGH being inputted through the first terminal of the fifth transistor M5 and transmitted to the output terminal through the turned-on fifth transistor M5.

The sixth transistor M6 transmitting the second power signal VGL to the output terminal in response to the signal of the second node N2 includes: the sixth transistor M6 being turned on when the signal of the second node N2 is at a low level, and the second power signal VGL being inputted through the first terminal of the sixth transistor M6 and transmitted to the output terminal through the turned-on sixth transistor M6.

Taking the shift register shown in FIG. 3 as an example, in combination with FIG. 2, it can be seen that, only when the first drive signal Emit1 is at a high level and the second drive signal S1-$p$ is at a low level, the shift register outputs a high-level third drive signal S-n. When the first drive signal Emit1 and the second drive signal S1-$p$ are other signal combinations, the shift register outputs a low-level third drive signal S-n.

On the basis of the foregoing embodiments, in another embodiment of the present disclosure, the display device 100 further includes a fourth drive circuit 124. The fourth drive circuit 124 is configured to provide a third gate drive signal for the pixel circuit 200.

The third drive circuit 123 is configured to: receive the first power signal VGH and the second power signal VGL, and output the second gate drive signal in response to the light-emitting control signal, the third gate drive signal and the first gate drive signal.

In this embodiment, the third gate drive signal corresponds to the aforementioned fourth drive signal S2-$p$, and the first gate drive signal, the second gate drive signal, the third gate drive signal and the light-emitting control signal cooperate with each other, to realize emit dimming function of the pixel circuit 200. The emit dimming function includes, but is not limited to, PWM (Pulse Width Modulation) dimming and DC (Direct-Current) dimming.

In this embodiment, the signal of the first node N1 is controlled through the cooperation of the third control device 4 and the fourth drive signal S2-$p$. Thus, the control logic of the shift register is more diversified. That is, a third control signal outputted by the shift register has more diversified timing sequences based on the cooperation of the first control signal, the second control signal and the fourth control signal, and satisfying requirements of different gate drive circuits.

FIG. 4 further shows a first capacitor C1 of the output device 3. One terminal of the first capacitor C1 is connected to the second node N2, and the other terminal of the first capacitor C1 is connected to the output terminal. The first capacitor C1 is configured to maintain a potential of the second node N2.

For a specific structure of the third control device 4, reference is made to FIG. 5, which is a schematic diagram of a circuit structure of a shift register according to an embodiment of the present disclosure. The third control device 4 includes: a seventh transistor M7 and an eighth transistor M8.

The seventh transistor M7 is configured to transmit the second power signal VGL to the first node N1 in response to the fourth drive signal S2-$p$.

The eighth transistor M8 is configured to transmit the first power signal VGH to the third node N3 in response to the fourth drive signal S2-$p$.

In this embodiment, the third control device 4 functions to control the signal of the first node N1 through only the two transistors. Thus, the structure of the device is simple, which is beneficial to simplify the overall circuit structure of the shift register. In addition, the signal of the third node N3 is also controlled by the third control device 4, and avoiding the output device 3 outputting wrong signals due to the signal of the first node N1 and the signal of the third node N3 (or the signal of the second node N2) being the same.

Referring to FIG. 5, a connection relationship of the seventh transistor M7 and the eighth transistor M8 is described as follows.

A first terminal of the seventh transistor M7 is connected to the second power signal VGL, a second terminal of the seventh transistor M7 is connected to the first node N1, and a control terminal of the seventh transistor M7 is connected to the fourth drive signal S2-$p$.

A first terminal of the eighth transistor M8 is connected to the first power signal VGH, a second terminal of the eighth transistor M8 is connected to the third node N3, and a control terminal of the eighth transistor M8 is connected to the fourth drive signal S2-$p$.

In FIG. 5, the seventh transistor M7 and the eighth transistor M8 both being P-type transistors are described as an example for illustration. In other embodiments of the present disclosure, the seventh transistor M7 and the eighth transistor M8 may alternatively be N-type transistors, which is not limited in the present disclosure.

If the seventh transistor M7 and the eighth transistor M8 are both P-type transistors, the seventh transistor M7 transmitting the second power signal VGL to the first node N1 in response to the fourth drive signal S2-p includes: the seventh transistor M7 being turned on when the fourth drive signal S2-p is at a low level, and the second power signal VGL being inputted through the first terminal of the turned-on seventh transistor M7 and transmitted to the first node N1 through the turned-on seventh transistor M7, and the signal of the first node N1 is the second power signal VGL, and controlling the signal of the first node N1.

The eighth transistor M8 transmitting the first power signal VGH to the third node N3 in response to the fourth drive signal S2-p includes: the eighth transistor M8 being turned on when the fourth drive signal S2-p is at a low level, and the first power signal VGH being inputted through the first terminal of the eighth transistor M8 and transmitted to the third node N3 through the turned-on eighth transistor M8. Since the third node N3 is connected to the second node N2, the first power signal VGH is transmitted to the second node N2 through the third node N3. Thus the signal of the second node N2 is the first power signal VGH, and the signal of the second node N2 is controlled.

On the basis of the foregoing embodiments, in another embodiment of the present disclosure, a shift register is provided. Reference is made to FIG. 6, which is a schematic diagram of a circuit structure of the shift register according to the embodiment of the present disclosure. The first control device 1 further includes a stabilization device 11. The third node N3 is connected to the second node N2 through the stabilization device 11.

The stabilization device 11 is configured to stabilize a potential of the second node N2.

In this embodiment, the potential of the second node N2 may be stabilized to the potential of the first power signal VGH or the potential of the second power signal VGL due to the stabilization device 11, and wrong response of the output device 3 due to fluctuations of the potential of the second node N2 is avoided, and avoiding a wrong third drive signal S-n outputted by the output device 3, and avoiding the third drive signal S-n mixed with noise outputted by the output device 3 due to fluctuations of the potential of the second node N2.

For a feasible structure of the stabilization device 11, reference is made to FIG. 7, which is a schematic diagram of a circuit structure of the shift register. The stabilization device 11 includes a ninth transistor M9. A first terminal of the ninth transistor M9 is connected to the third node N3, a second terminal of the ninth transistor M9 is connected to the second node N2, and a control terminal of the ninth transistor M9 is connected to the second power signal VGL.

In this embodiment, the potential of the second node N2 is stabilized through only one transistor of the stabilization device 11. Thus, the structure of the device is simple, which is beneficial to simplify the overall circuit structure of the shift register.

Taking the shift register shown in FIG. 7 as an example, a timing relationship of the first drive signal Emit1, the second drive signal S1-p, the third drive signal S-n, and the fourth drive signal S2-p is explained in conjunction with FIG. 8, which is a schematic diagram of a timing relationship of the first drive signal Emit1, the second drive signal S1-p, the third drive signal S-n and the fourth drive signal S2-p according to an embodiment of the present disclosure.

In T0 stage, the sixth transistor M6, the first transistor M1, the second transistor M2, the fifth transistor M5, and the ninth transistor M9 are turned on, and the other transistors are turned off. The signal of the first node N1 is the second power signal VGL (which is represented by a low-level signal below), the signal of the second node N2 is the first power signal VGH (which is represented by a high-level signal below), and the third drive signal S-n is a low-level signal.

In T1 stage, the sixth transistor M6, the second transistor M2, and the ninth transistor M9 are turned on, and the other transistors are turned off. The signal of the first node N1 is at a low level, the signal of the second node N2 is at a high level, and the third drive signal S-n is at a low level.

In T2 stage, the fifth transistor M5, the third transistor M3, the fourth transistor M4, and the ninth transistor M9 are turned on, and the other transistors are turned off. The signal of the third node N3 is at a high level, the signal of the first node N1 is at a high level, the signal of the second node N2 is at a low level, and the third drive signal S-n is at a high level.

In T3 stage, the fifth transistor M5, the seventh transistor M7, the eighth transistor M8, and the ninth transistor M9 are turned on, and the other transistors are turned off. The signal of the third node N3 is at a high level, the signal of the first node N1 is at a high level, the signal of the second node N2 is at a low level, and the third drive signal S-n is at a high level.

In T4 stage, only the fifth transistor M5 and the ninth transistor M9 are turned on, and the other transistors are turned off. At this time, the signal of the third node N3 is at a high level, the signal of the first node N1 is at a high level, the signal of the second node N2 is at a low level, and the third drive signal S-n is maintained at a high level.

In T5 stage, the first transistor M1, the second transistor M2, the ninth transistor M9, and the sixth transistor M6 are turned on, and the other transistors are turned off. The signal of the first node N1 is at a low level, the signal of the second node N2 is at a high-level, and the third drive signal S-n is at a low-level.

Figure 13:
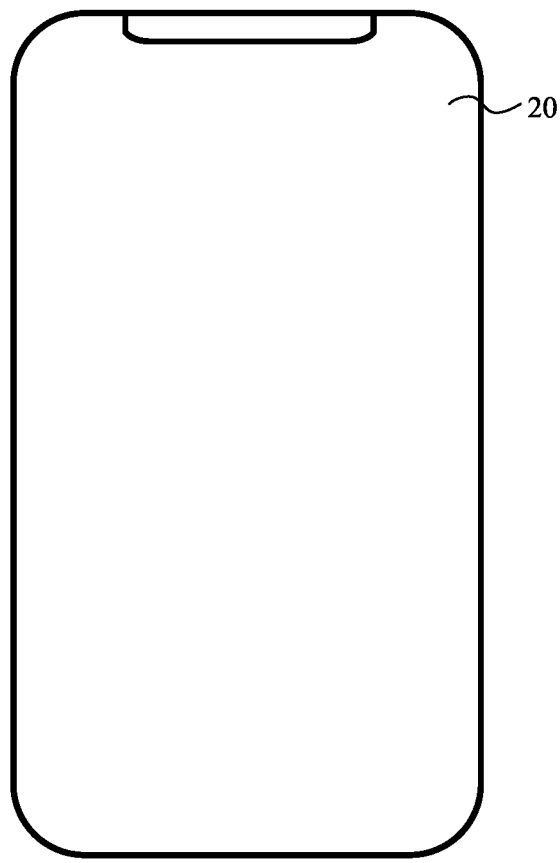
FIG. 13 is a schematic diagram of a display device according to an embodiment of the present disclosure.

Reference is made to FIG. 13, which is a schematic diagram of a display device according to an embodiment of the present disclosure. The display device 20 may be a display panel, such as a display panel of a mobile phone, a display panel of a watch, and a display panel of a flat-panel display. The display device 20 may also be a display terminal product, such as a mobile phone, a television, a notebook computer, a watch, a smart wearable display device, etc., which is no limited in the present disclosure.

As stated in the above, a shift register and a display device are provided according to embodiments of the present disclosure. The shift register includes the first control device 1, the second control device 2, and the output device 3. The first control device 1, the second control device 2 and the output device 3 all receive the first power signal VGH and the second power signal VGL as working power signals. The first control device 1 controls the signal of the first node N1 and the signal of the second node N2 in response to the first drive signal Emit1. The second control device 2 controls the signal of the second node N2 in response to the second drive signal S1-p. The output device 3 outputs the third drive signal S-n in response to the signal of the first node N1 or the signal of the second node N2, and the third drive signal S-n is generated and outputted by utilizing the first drive signal Emit1 and the second drive signal S1-p outputted by some other shift register, and simplifying a circuit configuration of a shift register for generating the third drive signal S-n, reducing a size of the shift register for generating the third drive signal S-n, reducing an area of the bezel occupied by a gate drive circuit of the shift register, and achieving "narrow bezel".

The above embodiments in the specification are described in a progressive manner. Each of the embodiments is mainly focused on describing its differences from other embodiments, and references may be made among these embodiments with respect to the same or similar portions among these embodiments.

What is claimed is:

1. A display device, comprising a pixel circuit, a first drive circuit, a second drive circuit, and a third drive circuit, wherein:
   the pixel circuit is configured to provide a display drive signal for a pixel unit of a display panel, and the pixel circuit is connected to the first drive circuit, the second drive circuit, and the third drive circuit;
   the first drive circuit is configured to provide a light-emitting control signal for the pixel circuit;
   the second drive circuit is configured to provide a first gate drive signal for the pixel circuit; and
   the third drive circuit is configured to: receive a first power signal and a second power signal, and output a second gate drive signal for the pixel circuit in response to the light-emitting control signal and the first gate drive signal, wherein the third drive circuit comprises:
     a first control module configured to: receive a first power signal and a second power signal, and control a signal of a first node and a signal of a second node in response to the light-emitting control signal;
     a second control module configured to: receive the first power signal and the second power signal, and control the signal of the first node in response to the first gate drive signal; and
     an output module configured to: receive the first power signal and the second power signal, and output a third drive signal through an output terminal in response to one of the signal of the first node and the signal of the second node.

2. The display device according to claim 1, wherein the first control module further comprises a third node connected to the second node.

3. The display device according to claim 2, wherein the first control module comprises a first transistor and a second transistor,
   the first transistor is configured to transmit the second power signal to the third node in response to the first drive signal, and
   the second transistor is configured to transmit the first power signal to the first node in response to the first drive signal.

4. The display device according to claim 3, wherein:
   a first terminal of the first transistor is connected to the second power signal, a second terminal of the first transistor is connected to the third node, and a control terminal of the first transistor is connected to the first drive signal; and
   a first terminal of the second transistor is connected to the first power signal, a second terminal of the second transistor is connected to the first node, and a control terminal of the second transistor is connected to the second terminal of the first transistor.

5. The display device according to claim 2, wherein the second control module comprises a third transistor and a fourth transistor,
   the third transistor is configured to transmit the second power signal to the first node in response to the second drive signal, and
   the fourth transistor is configured to transmit the first power signal to the third node in response to the second drive signal.

6. The display device according to claim 5, wherein:
   a first terminal of the third transistor is connected to the second power signal, a second terminal of the third transistor is connected to the first node, and a control terminal of the third transistor is connected to the second drive signal; and
   a first terminal of the fourth transistor is connected to the first power signal, a second terminal of the fourth transistor is connected to the third node, and a control terminal of the fourth transistor is connected to the second drive signal.

7. The display device according to claim 2, wherein the output module comprises a fifth transistor and a sixth transistor,
   the fifth transistor is configured to transmit the first power signal to the output terminal in response to the signal of the first node, and
   the sixth transistor is configured to transmit the second power signal to the output terminal in response to the signal of the second node.

8. The display device according to claim 7, wherein:
   a first terminal of the fifth transistor is connected to the first power signal, a second terminal of the fifth transistor is connected to the output terminal, and a control terminal of the fifth transistor is connected to the first node; and
   a first terminal of the sixth transistor is connected to the second power signal, a second terminal of the sixth transistor is connected to the output terminal, and a control terminal of the sixth transistor is connected to the second node.

9. The display device according to claim 2, further comprising: a third control module configured to: receive the first power signal and the second power signal, and control the signal of the first node in response to a fourth drive signal.

10. The display device according to claim 9, wherein the third control module comprises a seventh transistor and an eighth transistor,
    the seventh transistor is configured to transmit the second power signal to the first node in response to the fourth drive signal, and
    the eighth transistor is configured to transmit the first power signal to the third node in response to the fourth drive signal.

11. The display device according to claim 10, wherein:
    a first terminal of the seventh transistor is connected to the second power signal, a second terminal of the seventh transistor is connected to the first node, and a control terminal of the seventh transistor is connected to the fourth drive signal; and
    a first terminal of the eighth transistor is connected to the first power signal, a second terminal of the eighth transistor is connected to the third node, and a control terminal of the eighth transistor is connected to the fourth drive signal.

12. The display device according to claim 2, wherein the first control module further comprises a stabilization module, the third node is connected to the second node through the stabilization module; and the stabilization module is configured to stabilize a potential of the second node.

13. The display device according to claim 12, wherein the stabilization module comprises a ninth transistor; and
   a first terminal of the ninth transistor is connected to the third node, a second terminal of the ninth transistor is connected to the second node, and a control terminal of the ninth transistor is connected to the second power signal.

14. The display device according to claim 1, further comprising:
   a fourth drive circuit configured to: provide a third gate drive signal for the pixel circuit, wherein
   the third drive circuit further comprises:
      a third control module configured to: receive the first power signal and the second power signal, and control the signal of the first node in response to the third gate drive signal.

15. The display device according to claim 14, wherein:
   the pixel circuit comprises: a data writing module, a compensation module, a driver module, a light-emitting control module and an initialization module;
   the light-emitting control signal is used to control the light-emitting control module, the first gate drive signal is used to control the initialization module, the second gate drive signal is used to control the compensation module, and the third gate drive signal is used to control the data writing module.

16. The display device according to claim 15, wherein
   the pixel circuit comprises at least one oxide semiconductor transistor and at least one poly-silicon transistor.

17. The display device according to claim 16, wherein
   the compensation module comprises an oxide semiconductor transistor.

18. A display device, comprising a pixel circuit, wherein:
   the pixel circuit is configured to provide a display drive signal for a pixel unit of a display panel;
   the pixel circuit is connected to a first drive circuit, a second drive circuit, a third drive circuit;
   the first drive circuit is configured to provide a light-emitting control signal for the pixel circuit, the second drive circuit is configured to provide a first gate drive signal for the pixel circuit, and the third drive circuit is configured to provide a second gate drive signal for the pixel circuit; and
   the third drive circuit is configured to: receive a first power signal and a second power signal, and output the second gate drive signal in response to the light-emitting control signal and the first gate drive signal.

19. The display device according to claim 18, further comprising:
   a fourth drive circuit configured to: provide a third gate drive signal for the pixel circuit, wherein
   the third drive circuit is configured to: receive the first power signal and the second power signal, and output the second gate drive signal in response to the light-emitting control signal, the first gate drive signal and the third gate drive signal.

* * * * *